US012796023B2

(12) United States Patent
Kim et al.

(10) Patent No.: US 12,796,023 B2
(45) Date of Patent: Nov. 10, 2026

(54) SEMICONDUCTOR DEVICE INCLUDING MULTI-BRIDGE CHANNEL FIELD EFFECT TRANSISTOR

(71) Applicant: SAMSUNG ELECTRONICS CO., LTD., Suwon-si (KR)

(72) Inventors: Gyeom Kim, Suwon-si (KR); Da Hye Kim, Suwon-si (KR); Young Kwang Kim, Suwon-si (KR); Jin Bum Kim, Suwon-si (KR); Kyung Bin Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 553 days.

(21) Appl. No.: 18/229,218

(22) Filed: Aug. 2, 2023

(65) Prior Publication Data

US 2024/0153991 A1 May 9, 2024

(30) Foreign Application Priority Data

Nov. 3, 2022 (KR) ........................ 10-2022-0145163

(51) Int. Cl.
*H10D 62/10* (2025.01)
*H10D 30/43* (2025.01)
*H10D 30/67* (2025.01)

(52) U.S. Cl.
CPC ........... *H10D 62/121* (2025.01); *H10D 30/43* (2025.01); *H10D 30/6729* (2025.01); *H10D 30/6735* (2025.01); *H10D 30/6757* (2025.01)

(58) Field of Classification Search
CPC .... H10D 62/121; H10D 62/822; H10D 30/43; H10D 30/6729; H10D 30/6735;
(Continued)

(56) References Cited

U.S. PATENT DOCUMENTS 10,431,661 B2 10/2019 Liu et al.
11,024,741 B2 6/2021 Song et al.
(Continued)

FOREIGN PATENT DOCUMENTS

KR 10-2022-0086217 A 6/2022

OTHER PUBLICATIONS

Notice of Allowance dated May 5, 2026 issued in the corresponding Korean Patent Application No. 10-2022-0145163.

*Primary Examiner* — Calvin Y Choi
(74) *Attorney, Agent, or Firm* — MORGAN, LEWIS & BOCKIUS LLP

(57) ABSTRACT

A semiconductor device includes: an active pattern including a lower pattern and a plurality of sheet patterns that are spaced apart from the lower pattern; a gate structure disposed on the lower pattern; and a source/drain pattern disposed on the lower pattern, and connected to each of the plurality of sheet patterns, wherein the plurality of sheet patterns include a first sheet pattern and a second sheet pattern. The second sheet pattern is disposed between the first sheet pattern and the lower pattern. A first upper width of an upper surface of the first sheet pattern is greater than a first lower width of a bottom surface of the first sheet pattern, and a second upper width of an upper surface of the second sheet pattern is smaller than a second lower width of a bottom surface of the second sheet pattern.

20 Claims, 21 Drawing Sheets

(58) Field of Classification Search
CPC .. H10D 30/6757; H10D 30/62; H10D 30/014; H10D 30/6713; H10D 84/853
See application file for complete search history.

(56) References Cited

U.S. PATENT DOCUMENTS

| | | | | |
|---|---|---|---|---|
| 11,227,952 | B2 | 1/2022 | Song et al. | |
| 11,264,381 | B2 | 3/2022 | Lee et al. | |
| 11,348,999 | B2 | 5/2022 | Reznicek et al. | |
| 2021/0257499 | A1* | 8/2021 | Shin | H10D 30/014 |
| 2022/0052046 | A1 | 2/2022 | Choi et al. | |
| 2022/0190109 | A1 | 6/2022 | Choi et al. | |
| 2022/0190134 | A1 | 6/2022 | Jeong et al. | |
| 2023/0361184 | A1* | 11/2023 | Liao | H10D 30/031 |

* cited by examiner

SEMICONDUCTOR DEVICE INCLUDING MULTI-BRIDGE CHANNEL FIELD EFFECT TRANSISTOR

CROSS-REFERENCE TO RELATED APPLICATION

This application claims priority under 35 USC § 119 to Korean Patent Application No. 10-2022-0145163 filed on Nov. 3, 2022 in the Korean Intellectual Property Office, the disclosure of which is incorporated by reference herein in its entirety.

TECHNICAL FIELD

The present inventive concept relates to a semiconductor device, and more particularly, to a semiconductor device including a MBCFET™ (Multi-Bridge Channel Field Effect) Transistor.

DISCUSSION OF THE RELATED ART

A scaling scheme for increasing an integration density of a semiconductor device proposes, generally, a multi-gate transistor in which a multi-channel active pattern (or a silicon body) in a shape of a fin or a nanowire is formed on a substrate, and a gate is formed on the multi-channel active pattern.

Because such a multi-gate transistor uses a three-dimensional channel, the transistor may be easy to scale the same. Further, current control capability of the multi-gate transistor may be increased without increasing a gate length of the multi-gate transistor. In addition, the multi-gate transistor may effectively suppress SCE (short channel effect) in which potential of a channel area is affected by drain voltage.

SUMMARY

According to an embodiment of the present inventive concept, a semiconductor device includes: an active pattern including a lower pattern and a plurality of sheet patterns, wherein the lower pattern extends in a first direction, and the plurality of sheet patterns are spaced apart from the lower pattern in a second direction crossing the first direction; a gate structure disposed on the lower pattern and including a gate electrode, a gate insulating film and a gate spacer; and a source/drain pattern disposed on the lower pattern, and connected to each of the plurality of sheet patterns, wherein the plurality of sheet patterns include a first sheet pattern and a second sheet pattern adjacent to each other in the second direction. The second sheet pattern is disposed between the first sheet pattern and the lower pattern. Each of the first sheet pattern and the second sheet pattern includes an upper surface and a bottom surface opposite to each other in the second direction. The bottom surface of the first sheet pattern faces the upper surface of the second sheet pattern. A first upper width, in the first direction, of the upper surface of the first sheet pattern is greater than a first lower width, in the first direction, of the bottom surface of the first sheet pattern, and a second upper width, in the first direction, of the upper surface of the second sheet pattern is smaller than a second lower width, in the first direction, of the bottom surface of the second sheet pattern.

According to an embodiment of the present inventive concept, a semiconductor device includes: an active pattern including a lower pattern and a plurality of sheet patterns, wherein the lower pattern extends in a first direction, and the plurality of sheet patterns are spaced apart from the lower pattern in a second direction crossing the first direction; a gate structure disposed on the lower pattern and including a gate electrode, a gate insulating film and a gate spacer; and a source/drain pattern disposed on the lower pattern, and connected to each of the plurality of sheet patterns, wherein the source/drain pattern includes a lower source/drain area and an upper source/drain area, wherein the lower source/drain area is in contact with the lower pattern, and the upper source/drain area is disposed on the lower source/drain area. The gate structure includes an inner gate structure disposed between the lower pattern and a bottommost sheet pattern of the plurality of sheet patterns, and between adjacent sheet patterns, wherein the inner gate structure includes the gate electrode and the gate insulating film. The source/drain pattern is in contact with the gate insulating film of the inner gate structure. The upper source/drain area includes an upper source/drain outer side surface in contact with the plurality of sheet patterns and the inner gate structure. The lower source/drain area includes a lower source/drain outer side surface in contact with the plurality of sheet patterns and the inner gate structure and directly connected to the upper source/drain outer side surface a sign of a slope of the upper source/drain outer side surface is opposite to a sign of a slope of the lower source/drain outer side surface, and an intersection at which the upper source/drain outer side surface and the lower source/drain outer side surface meet each other is in contact with the inner gate structure.

According to an embodiment of the present inventive concept, a semiconductor device includes: an active pattern including a lower pattern and a plurality of sheet patterns, wherein the lower pattern extends in a first direction, and the plurality of sheet patterns are spaced apart from the lower pattern in a second direction crossing the first direction; a gate structure disposed on the lower pattern and including a gate electrode and a gate insulating film; and a source/drain pattern disposed on the lower pattern, and connected to each of the plurality of sheet patterns, wherein the gate structure includes an inner gate structure disposed between the lower pattern and a bottommost sheet pattern of the plurality of sheet patterns, and between adjacent sheet patterns, wherein the inner gate structure includes the gate electrode and the gate insulating film. The source/drain pattern is in contact with the gate insulating film of the inner gate structure. The plurality of sheet patterns includes a first sheet pattern and a second sheet pattern adjacent to each other in the second direction. The first sheet pattern is disposed as an uppermost sheet pattern among the plurality of sheet patterns. Each of the first sheet pattern and the second sheet pattern includes a sidewall in contact with the source/drain pattern. A sign of a slope of the sidewall of the first sheet pattern is opposite to a sign of a slope of the sidewall of the second sheet pattern. Each of the first sheet pattern and the second sheet pattern includes an upper surface and a bottom surface opposite to each other in the second direction. The bottom surface of the first sheet pattern faces the upper surface of the second sheet pattern, and a point at which the source/drain pattern has a maximum width in the first direction is positioned between the bottom surface of the first sheet pattern and the upper surface of the second sheet pattern.

BRIEF DESCRIPTION OF DRAWINGS

The above and features of the present inventive concept will become more apparent by describing in detail embodiments thereof with reference to the attached drawings, in which.

DETAILED DESCRIPTIONS OF EMBODIMENTS

Figure 1:
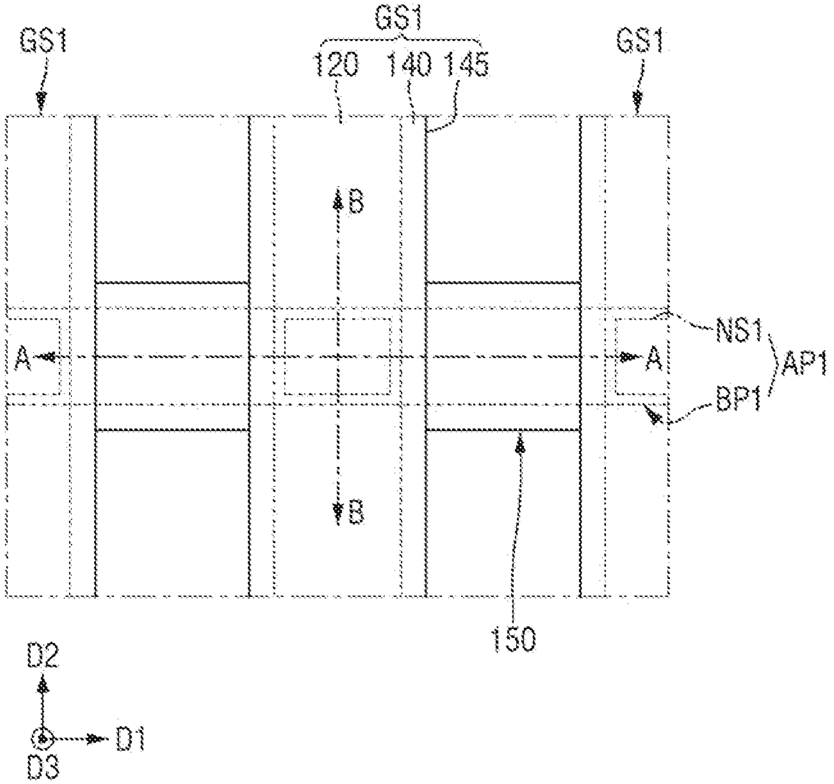
FIG. 1 is an illustrative plan view for illustrating a semiconductor device according to an embodiment of the present inventive concept.

For simplicity and clarity of illustration, elements in the drawings are not necessarily drawn to scale. The same reference numbers in different drawings represent the same or similar elements throughout the specification and drawings, and as such perform similar functionality. Examples of various embodiments are illustrated and described further below. It is to be understood that the present inventive concept may, however, be embodied in different forms and thus should not be construed as being limited to the exemplary embodiments set forth herein.

As used herein, the singular forms "a" and "an" are intended to include the plural forms as well, unless the context clearly indicates otherwise. As used herein, the term "and/or" includes any and all combinations of one or more of the associated listed items. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present inventive concept.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or another layer, film, region, plate, or the like may be disposed between the former and the latter. As used herein, when a layer, film, region, plate, or the like is directly disposed "on" or "on a top" of another layer, film, region, plate, or the like, the former directly contacts the latter and another layer, film, region, plate, or the like is not disposed between the former and the latter. Further, as used herein, when a layer, film, region, plate, or the like may be disposed "below" or "under" another layer, film, region, plate, or the like, the former may directly contact the latter or another layer, film, region, plate, or the like may be disposed between the former and the latter. As used herein, when a layer, film, region, plate, or the like is directly disposed "below" or "under" another layer, film, region, plate, or the like, the former directly contacts the latter and another layer, film, region, plate, or the like is not disposed between the former and the latter.

When an embodiment of the present invention may be implemented differently, a process order may be performed differently from the described order. For example, two consecutively described processes may be performed at substantially the same time or performed in an order opposite to the described order.

In descriptions of temporal relationships, for example, temporal precedent relationships between two events such as "after", "subsequent to", "before", etc., another event may occur therebetween unless "directly after", "directly subsequent" or "directly before" is indicated. The features of the various embodiments of the present inventive concept may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to illustrate one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction D1", "second direction D2" and "third direction D3" should not be interpreted only to have a geometric relationship in which the first direction, the second direction, and the third direction cross each other (e.g., are perpendicular to each other). The "first direction D1", "second direction D2" and "third direction D3" may be interpreted to have a broader direction within a range in which components herein may work functionally.

A semiconductor device according to some embodiments of the present inventive concept may include a fin-type transistor (FinFET), a tunneling transistor (tunneling FET), a 3-dimensional (3D) transistor, or a vertical transistor (vertical FET). A semiconductor device according to some embodiments of the present inventive concept may include a planar transistor. In addition, the present inventive concept may be applied to a transistor (2D material-based FET) based on a 2D material, and a heterostructure thereof.

Further, the semiconductor device according to some embodiments of the present inventive concept may include a bipolar junction transistor, a LDMOS (lateral double diffused metal oxide semiconductor) transistor, and the like.

With reference to FIG. 1 to FIG. 7, descriptions will be made of a semiconductor device according to some embodiments of the present inventive concept.

Figure 2:
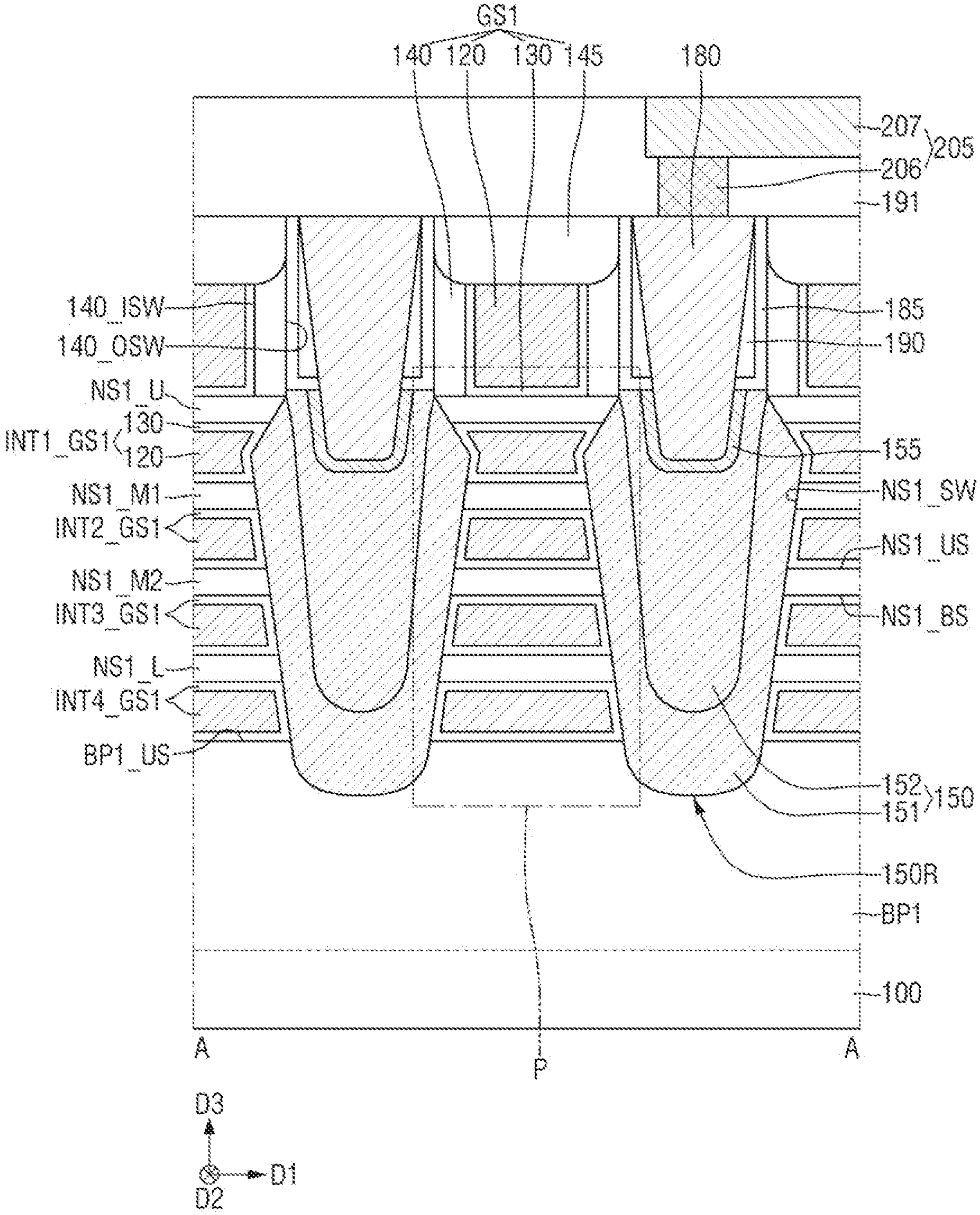
FIGS. 2 and 3 are cross-sectional views taken along A-A and B-B of FIG. 1.
Figure 3:
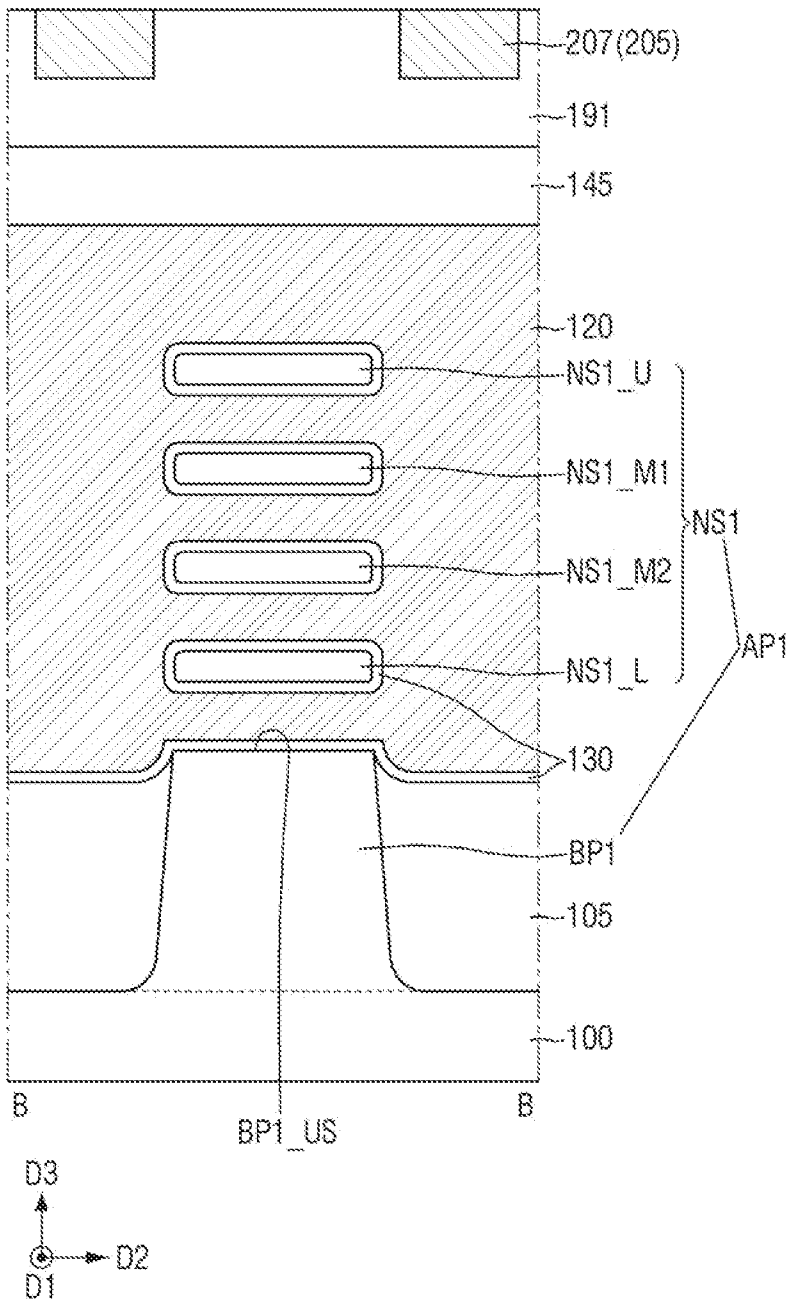
Figure 4:
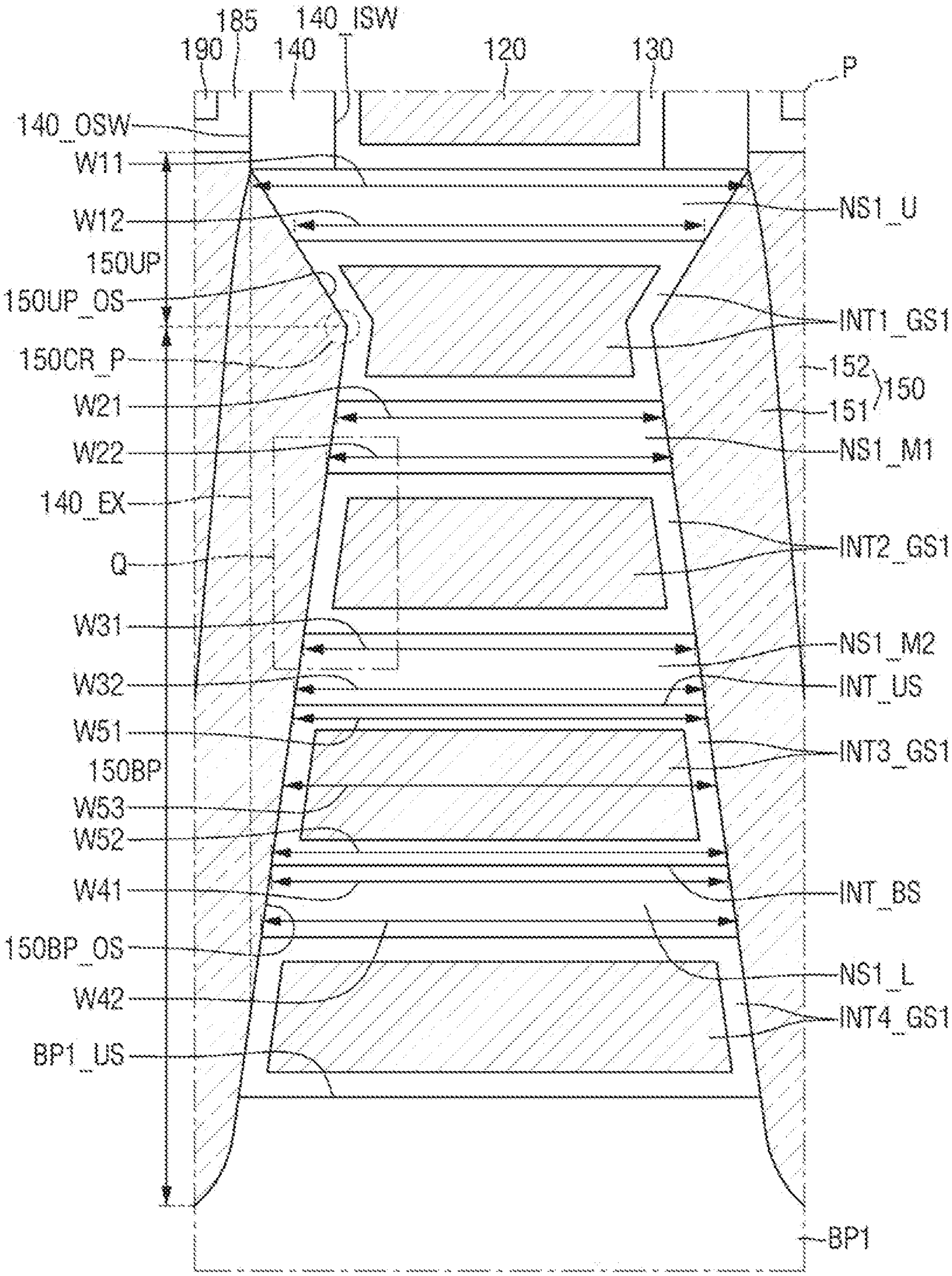
FIG. 4 is an enlarged view of a P area of FIG. 2.
Figure 5:
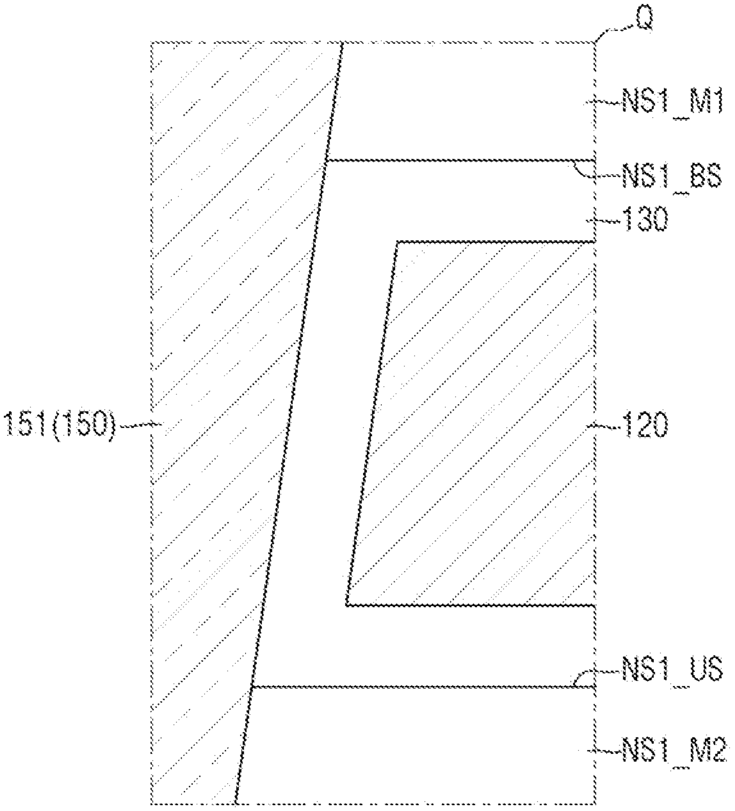
FIGS. 5, 6 and 7 are enlarged views of a Q portion of FIG. 4.
Figure 6:
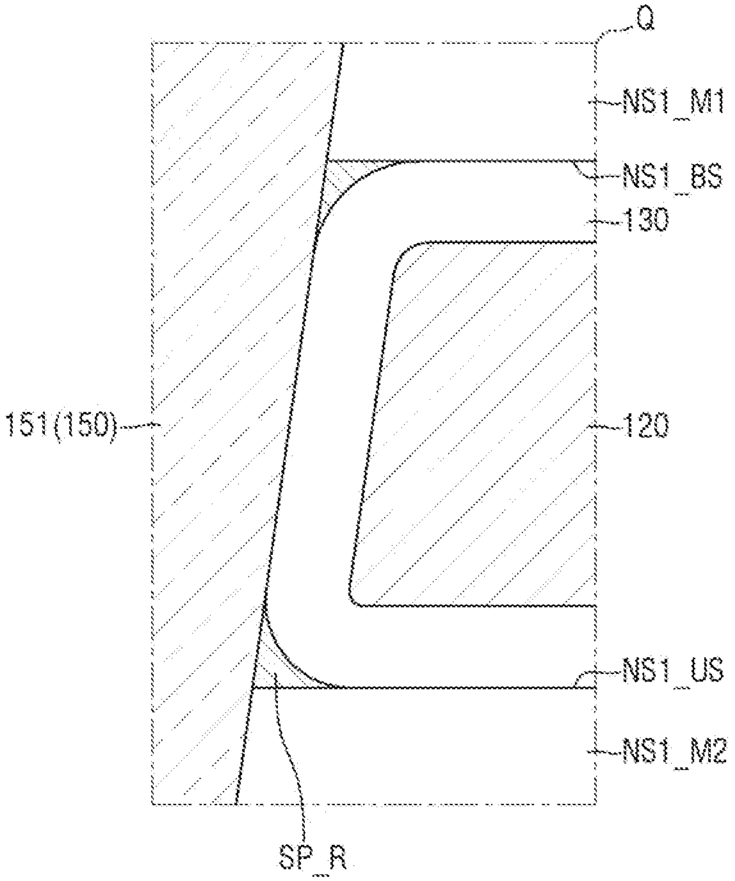
Figure 7:
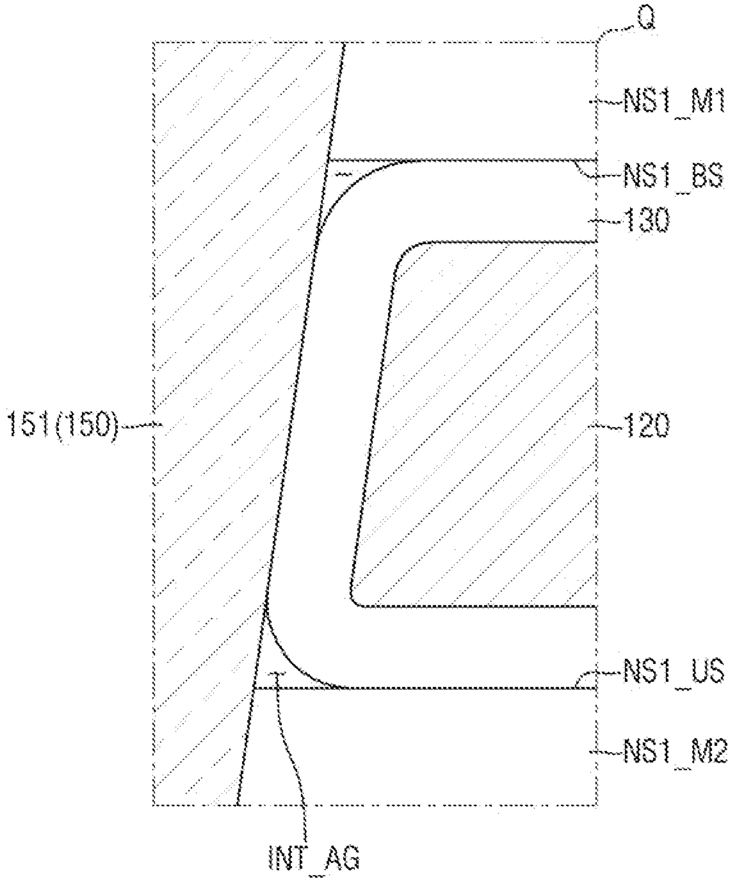

FIG. 1 is an illustrative plan view for illustrating a semiconductor device according to some embodiments of the present inventive concept. FIGS. 2 and 3 are cross-sectional views taken along A-A and B-B of FIG. 1. FIG. 4 is an enlarged view of a P area of FIG. 2. FIGS. 5 to 7 are enlarged views of a Q portion of FIG. 4.

For reference, FIG. 1 is shown briefly except a first gate insulating film 130, a first source/drain contact 180, a source/drain etch stop film 185, interlayer insulating films 190 and 191, and a wiring structure 205 are omitted for clarity.

Referring to FIGS. 1 to 7, a semiconductor device according to some embodiments of the present inventive concept may include a substrate 100, a first active pattern AP1, a plurality of first gate electrodes 120, a plurality of first gate structures GS1, and a first source/drain pattern 150.

The substrate 100 may be made of bulk silicon or SOI (silicon-on-insulator). In addition, the substrate 100 may be embodied as a silicon substrate, or may be made of a material other than silicon, such as silicon germanium, SGOI (silicon germanium on insulator), indium antimonide, lead telluride, indium arsenide, indium phosphide, gallium arsenide or gallium antimonide, but the present inventive concept might not be limited thereto.

The first active pattern AP1 may be disposed on the substrate 100. The first active pattern AP1 may extend long in the first direction D1. For example, the first active pattern AP1 may be disposed in an area where a PMOS is formed.

The first active pattern AP1 may be, for example, a multi-channel active pattern. The first active pattern AP1 may include a first lower pattern BP1 and a plurality of first sheet patterns NS1.

The first lower pattern BP1 may protrude from the substrate 100. The first lower pattern BP1 may extend long in the first direction D1.

The plurality of first sheet patterns NS1 may be disposed on an upper surface BP1_US of the first lower pattern BP1. The plurality of first sheet patterns NS1 may be spaced apart from the first lower pattern BP1 in the third direction D3. The first sheet patterns NS1 may be spaced apart from each other in the third direction D3. The third direction D3 may be a direction crossing the first direction D1 and second direction D2. For example, the third direction D3 may be a thickness direction of the substrate 100. The first direction D1 may be a direction crossing the second direction D2.

The first sheet patterns NS1 may include a first bottommost sheet pattern NS1_L and a first uppermost sheet pattern NS1_U. The first bottommost sheet pattern NS1_L may be a sheet pattern closest to the first lower pattern BP1 among the plurality of first sheet patterns NS1. The first uppermost sheet pattern NS1_U may be a sheet pattern farthest from the first lower pattern BP1 among the plurality of first sheet patterns NS1.

The first sheet patterns NS1 may include a first middle sheet pattern NS1_M1 and a second middle sheet pattern NS1_M2 disposed between the first bottommost sheet pattern NS1_L and the first uppermost sheet pattern NS1_U. The first middle sheet pattern NS1_M1 may be disposed between the first uppermost sheet pattern NS1_U and the second middle sheet pattern NS1_M2.

For example, the first bottommost sheet pattern NS1_L may be closest to the second middle sheet pattern NS1_M2 in the third direction D3, among the first sheet patterns NS1. For example, the first middle sheet pattern NS1_M1 may be closest to the second middle sheet pattern NS1_M2 in the third direction D3. However, the present inventive concept is not limited thereto.

An example in which the first sheet patterns NS1 includes two sheet patterns disposed between the first bottommost sheet pattern NS1_L and the first uppermost sheet pattern NS1_U is illustrated. However, the present disclosure is not limited thereto. The first sheet patterns NS1 may include three or more sheet patterns arranged between the first bottommost sheet pattern NS1_L and the first uppermost sheet pattern NS1_U.

Each of the first sheet patterns NS1 includes an upper surface NS1_US and a bottom surface NS1_BS. The upper surface NS1_US of the first sheet pattern NS1 is opposite to the bottom surface NS1_BS of the first sheet pattern NS1 in the third direction D3. For example, the bottom surface NS1_BS of the first uppermost sheet pattern NS1_U faces the upper surface NS1_US of the first middle sheet pattern NS1_M1. The bottom surface NS1_BS of the first sheet pattern NS1 faces the upper surface BP1_US of the first lower pattern BP1.

Each of the first sheet patterns NS1 includes a sidewall NS1_SW connecting the upper surface NS1_US of the first sheet pattern NS1 and the bottom surface NS1_BS of the first sheet pattern NS1 to each other. Each of the first sheet patterns NS1 includes two sidewalls NS1_SW. The two sidewalls NS1_SW of each of the first sheet patterns NS1 are spaced apart from each other in the first direction D1. The sidewall NS1_SW of the first sheet pattern NS1 contacts the first source/drain pattern 150 which will be described later.

The first lower pattern BP1 may be formed by etching a portion of the substrate 100, or may include an epitaxial layer grown from the substrate 100. The first lower pattern BP1 may include, for example, silicon or germanium as an elemental semiconductor material. Further, the first lower pattern BP1 may include a compound semiconductor, for example, a group IV-IV compound semiconductor or a group III-V compound semiconductor.

The group IV-IV compound semiconductor may include, for example, a binary compound including two of carbon (C), silicon (Si), germanium (Ge), and tin (Sn), a ternary compound including three thereof, or a compound obtained by doping a group IV element thereto.

The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

The first sheet pattern NS1 may include one of silicon or germanium as an elemental semiconductor material, a group IV-IV compound semiconductor, or a group III-V compound semiconductor. Each of the first sheet patterns NS1 may include the same material as that of the first lower pattern BP1, or may include a material other than that of the first lower pattern BP1.

In the semiconductor device according to some embodiments of the present inventive concept, the first lower pattern BP1 may be a silicon lower pattern including silicon, and the first sheet pattern NS1 may be a silicon sheet pattern including silicon.

A width in the second direction D2 of the first sheet pattern NS1 may be increased or decreased in proportion to a width in the second direction D2 of the first lower pattern BP1. In one example, it is illustrated that the widths in the second direction D2 of the first sheet patterns NS1 arranged in the third direction D3 are equal to each other. However, this is intended only for convenience of illustration and the present inventive concept is not limited thereto. Unlike what is illustrated, as the distance from the first lower pattern BP1 increases, the widths of the first sheet patterns NS1 in the second direction D2, which are stacked in the third direction D3, may decrease.

The first bottommost sheet pattern NS1_L, the first middle sheet pattern NS1_M1, the second middle sheet pattern NS1_M2 and the first uppermost sheet pattern NS1_U will be described in detail later.

A field insulating film 105 may be formed on the substrate 100. The field insulating film 105 may be disposed on a sidewall of the first lower pattern BP1. The field insulating film 105 is not disposed on the upper surface BP1_US of the first lower pattern.

In one example, the field insulating film 105 may cover a sidewall of the first lower pattern BP1 entirely. Unlike what is illustrated, the field insulating film 105 may cover a portion of a sidewall of the first lower pattern BP1. In this case, a portion of the first lower pattern BP1 may protrude upwardly in the third direction D3 beyond an upper surface of the field insulating film 105.

Each of the first sheet patterns NS1 is disposed higher than the upper surface of the field insulating film 105. The field insulating film 105 may include, for example, an oxide film, a nitride film, an oxynitride film, or a combination thereof. Although the field insulating film 105 is illustrated as being embodied as a single film, this is intended only for convenience of illustration and the present inventive concept is not limited thereto.

The plurality of first gate structures GS1 may be disposed on the substrate 100. Each of the first gate structures GS1 may extend in the second direction D2. The first gate structures GS1 may be disposed to be spaced apart from each other in the first direction D1. The first gate structures GS1 may be adjacent to each other in the first direction D1. For example, the first gate structure GS1 may be disposed on each of both opposing sides of a first source/drain pattern 150 in the first direction D1.

The first gate structure GS1 may be disposed on the first active pattern AP1. The first gate structure GS1 may intersect the first active pattern AP1.

The first gate structure GS1 may intersect the first lower pattern BP1. The first gate structure GS1 may at least partially surround each of the first sheet patterns NS1.

The first gate structure GS1 may include, for example, a first gate electrode 120, a first gate insulating film 130, a first gate spacer 140, and a first gate capping pattern 145.

The first gate structures GS1 may include a plurality of inner gate structures INT1_GS1, INT2_GS1, INT3_GS1, and INT4_GS1 respectively disposed between adjacent the first sheet patterns NS1 in the third direction D3 and between the first lower pattern BP and the first sheet pattern NS1. The inner gate structures INT1_GS1, INT2_GS1, INT3_GS1, and INT4_GS1 may be respectively disposed between the upper surface BP1_US of the first lower pattern and a bottom surface NS1_BS of the first bottommost sheet pattern NS1_L, and an upper surface NS1_US of any first sheet pattern NS1 and a bottom surface NS1_BS of another first sheet pattern NS1 facing each other in the third direction D3.

The number of the inner gate structures INT1_GS1, INT2_GS1, INT3_GS1, and INT4_GS1 may be proportional to the number of the first sheet patterns NS1 included in the active pattern AP1. For example, the number of the inner gate structures INT1_GS1, INT2_GS1, INT3_GS1, and INT4_GS1 may be equal to the number of the first sheet patterns NS1. Since the first active pattern AP1 includes the plurality of first sheet patterns NS1, the first gate structure GS1 may include the plurality of inner gate structures INT1_GS1, INT2_GS1, INT3_GS1, and INT4_GS1.

The inner gate structures INT1_GS1, INT2_GS1, INT3_GS1, and INT4_GS1 may contact the upper surface BP1_US of the first lower pattern BP1, the upper surface NS1_US of the first sheet pattern NS1, and the bottom surface NS1_BS of the first sheet pattern NS1.

The inner gate structures INT1_GS1, INT2_GS1, INT3_GS1, and INT4_GS1 may contact the first source/drain pattern 150 to be described later. For example, the inner gate structures INT1_GS1, INT2_GS1, INT3_GS1, and INT4_GS1 may directly contact the first source/drain pattern 150.

The first gate structure GS1 may include a first inner gate structure INT1_GS1, a second inner gate structure INT2_GS1, a third inner gate structure INT3_GS1, and a fourth inner gate structure INT4_GS1. The first inner gate structure INT1_GS1, the second inner gate structure INT2_GS1, the third inner gate structure INT3_GS1, and the fourth inner gate structure INT4_GS1 may be disposed on the first lower pattern BP1 sequentially.

The fourth inner gate structure INT4_GS1 may be disposed between the first lower pattern BP1 and the first bottommost sheet pattern NS1_L. The fourth inner gate structure INT4_GS1 may be disposed at the bottommost of the inner gate structures INT1_GS1, INT2_GS1, INT3_GS1, and INT4_GS1. The fourth inner gate structure INT4_GS1 may be the lowest inner gate structure.

The first inner gate structure INT1_GS1 may be disposed between the first uppermost sheet pattern NS1_U and the first middle sheet pattern NS1_M1. The first inner gate structure INT1_GS1 may be disposed at the uppermost of the inner gate structures INT1_GS1, INT2_GS1, INT3_GS1, and INT4_GS1. The first inner gate structure INT1_GS1 may be an uppermost inner gate structure.

The second inner gate structure INT2_GS1 may be disposed between the first middle sheet pattern NS1_M1 and the second middle sheet pattern NS1_M2. The third inner gate structure INT3_GS1 may be disposed between the second middle sheet pattern NS1_M2 and the first bottommost sheet pattern NS1_L.

Each of the inner gate structures INT1_GS1, INT2_GS1, INT3_GS1, and INT4_GS1 include a first gate electrode 120 and a first gate insulating film 130 disposed between the adjacent first sheet patterns NS1 and between the first lower pattern BP1 and the first sheet pattern NS1.

Each of the inner gate structures INT1_GS1, INT2_GS1, INT3_GS1, and INT4_GS1 may include an upper surface INT_US facing the bottom surface NS1_BS of the first sheet pattern NS1. Each of the inner gate structures INT1_GS1, INT2_GS1, INT3_GS1, and INT4_GS1 may include a bottom surface INT_BS facing the upper surface NS1_US of the first sheet pattern NS1 or the upper surface BP1_US of the first lower pattern BP1. The upper surface INT_US of the inner gate structure is opposite to the bottom surface INT_BS of the inner gate structure in the third direction D3. A sidewall of each of the inner gate structures INT1_GS1, INT2_GS1, INT3_GS1, and INT4_GS1 connects the upper surface INT_US of the inner gate structure and the bottom surface INT_BS of the inner gate structure to each other.

The first gate electrode 120 may be formed on the first lower pattern BP1. The first gate electrode 120 may intersect the first lower pattern BP1. The first gate electrode 120 may surround the first sheet pattern NS1. A portion of the first gate electrode 120 may be disposed between the first sheet patterns NS1 adjacent to each other in the third direction D3 and between the first lower pattern BP1 and the first sheet pattern NS1.

The first gate electrode 120 may include at least one of a metal, a metal alloy, a conductive metal nitride, a metal silicide, a doped semiconductor material, a conductive metal oxide, and a conductive metal oxynitride. The first gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAI), titanium aluminum carbonitride (TiAIC-N), titanium aluminum carbide (TiAIC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. However, the present inventive concept is not limited thereto. The conductive metal oxide and the conductive metal oxynitride may include oxidized products of the above-mentioned materials. However, the present inventive concept is not limited thereto.

The first gate electrode 120 may be disposed on each of both opposing sides of the first source/drain pattern 150 to be described later. The first gate structure GS1 may be disposed on each of both opposing sides in the first direction D1 of the first source/drain pattern 150.

In one example, each of the first gate electrodes 120 disposed on each of both opposing sides of the first source/drain pattern 150 may be a normal gate electrode used as a gate of a transistor. In another example, the first gate electrode 120 disposed on one side of the first source/drain pattern 150 may be used as a gate of the transistor, while the first gate electrode 120 disposed on the other side of the first source/drain pattern 150 may be a dummy gate electrode.

The first gate insulating film 130 may extend along and on the upper surface of the field insulating film 105 and the upper surface BP1_US of the first lower pattern BP1. The first gate insulating film 130 may at least partially surround the plurality of first sheet patterns NS1. The first gate insulating film 130 may be disposed along a circumference of the first sheet pattern NS1. The first gate electrode 120 is disposed on the first gate insulating film 130. The first gate insulating film 130 is disposed between the first gate electrode 120 and the first sheet pattern NS1. A portion of the first gate insulating layer 130 may be disposed between first sheet patterns NS1 adjacent to each other in the third direction D3 and between the first lower pattern BP1 and the first sheet pattern NS1.

The first gate insulating film 130 may include, for example, silicon oxide, silicon-germanium oxide, germanium oxide, silicon oxynitride, silicon nitride, or a high-k material having a higher dielectric constant than that of silicon oxide. The high dielectric constant (high-k) material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although it is illustrated that the first gate insulating film 130 is a single film, this is intended only for convenience of illustration, and the present inventive concept is not limited thereto. The first gate insulating film 130 may include a plurality of films. The first gate insulating film 130 may include an interfacial film disposed between the first sheet pattern NS1 and the first gate electrode 120, and a high dielectric constant insulating film.

The semiconductor device according to some embodiments of the present inventive concept may include an NC (negative capacitance) FET using a negative capacitor. For example, the first gate insulating film 130 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. In addition, when at least one of capacitances of two or more capacitors connected in series to each other has a negative value, a total capacitance may have a positive value and may be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and/or lead zirconium titanium oxide. In this connection, in one example, hafnium zirconium oxide may be a material obtained by doping hafnium oxide with zirconium (Zr). In another example, hafnium zirconium oxide may be a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and/or yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and/or metal oxide having a high dielectric constant. Although, the metal oxide contained in the paraelectric material film may include, for example, at least one of hafnium oxide, zirconium oxide and/or aluminum oxide. However, the present inventive concept is not limited thereto.

The ferroelectric material film and the paraelectric material film may include the same material. The ferroelectric material film may have ferroelectric properties, but the paraelectric material film might not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, the present inventive concept is not limited thereto. Because a critical thickness exhibiting the ferroelectric properties may vary based on a type of the ferroelectric material, the thickness of the ferroelectric material film may vary depending on the type of the ferroelectric material.

In one example, the first gate insulating film 130 may include one ferroelectric material film. In another example, the first gate insulating film 130 may include a plurality of ferroelectric material films spaced apart from each other. The first gate insulating film 130 may have a multilayer structure in which a plurality of ferroelectric material films and a plurality of paraelectric material films are alternately stacked on each other.

The first gate spacer 140 may be disposed on a sidewall of the first gate electrode 120. The first gate spacer 140 might not be disposed between the first lower pattern BP1 and the first sheet pattern NS1 and between first sheet patterns NS1 adjacent to each other in the third direction D3. For example, the first gate spacer 140 may be disposed on the first sheet patterns NS1.

The first gate spacer 140 may include an inner sidewall 140_ISW and an outer sidewall 140_OSW. The inner sidewall 140_ISW of the first gate spacer 140 faces the first gate electrode 120 that extends in the second direction D2. The inner sidewall 140_ISW of the first gate spacer 140 may extend in the second direction D2. The outer sidewall 140_OSW of the first gate spacer 140 is opposite to the inner sidewall 140_ISW of the first gate spacer 140 in the first direction D1.

The first gate insulating film 130 may extend along the inner sidewall 140_ISW of the first gate spacer 140. For example, the first gate insulating film 130 may contact the inner sidewall 140_ISW of the first gate spacer.

The first gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), and combinations thereof. The present inventive concept is not limited thereto. Although it is illustrated that the first gate spacer 140 is a single film, this is intended only for convenience of illustration and the present inventive concept is not limited thereto.

The first gate capping pattern 145 may be disposed on the first gate electrode 120 and the first gate spacer 140. For example, an upper surface of the first gate capping pattern 145 may be substantially coplanar with an upper surface of the first interlayer insulating film 190. For example, the first gate capping pattern 145 may be disposed between the first gate spacers 140.

The first gate capping pattern 145 may include, for example, at least one of silicon nitride (SiN), silicon oxynitride (SiON), silicon carbonitride (SiCN), silicon oxycarbonitride (SiOCN), and combinations thereof. The first gate capping pattern 145 may include a material having an etching selectivity with respect to the first interlayer insulating film 190.

The first source/drain pattern 150 may be disposed on the first active pattern AP1. The first source/drain pattern 150 may be disposed on the first lower pattern BP1.

The first source/drain pattern 150 is connected to each of the first sheet patterns NS1. The first source/drain pattern 150 is connected to the first bottommost sheet pattern NS1_L, the first middle sheet pattern NS1_M1, the second middle sheet pattern NS1_M2, and the first uppermost sheet pattern NS1_U. For example, the first source/drain pattern 150 contacts each of the first sheet patterns NS1.

The first source/drain pattern 150 may be disposed on a side surface of the first gate structure GS1. The first source/drain pattern 150 may be disposed between the first gate structures GS1 that are adjacent to each other in the first direction D1. For example, the first source/drain pattern 150 may be disposed on each of both opposing sides of the first gate structure GS1. For example, the first source/drain pattern 150 may be disposed on one side of the first gate structure GS1, and might not be disposed on the other side of the first gate structure GS1.

The first source/drain pattern 150 may be included in a source/drain of a transistor using the first sheet pattern NS1 as a channel area thereof.

The first source/drain pattern 150 may be disposed in a first source/drain recess 150R. The first source/drain pattern 150 may fill the first source/drain recess 150R.

The first source/drain recess 150R extends in the third direction D3. The first source/drain recess 150R may be disposed between first gate structures GS1 adjacent to each other in the first direction D1.

A bottom surface of the first source/drain recess 150R is provided by the first lower pattern BP1. A sidewall of the first source/drain recess 150R may be provided by the first sheet pattern NS1 and the inner gate structure INT1_GS1, INT2_GS1, INT3_GS1, and INT4_GS1.

Each of the inner gate structures INT1_GS1, INT2_GS1, INT3_GS1, and INT4_GS1 includes a sidewall connecting the upper surface INT_US of the inner gate structure and the bottom surface INT_BS of the inner gate structure to each other. The sidewall of each of the inner gate structures INT1_GS1, INT2_GS1, INT3_GS1, and INT4_GS1 may provide a portion of the sidewall of the first source/drain recess 150R. The upper surface BP1_US of the first lower pattern BP1 may be a boundary surface between the fourth inner gate structure INT4_GS1 and the first lower pattern BP1. The bottom surface of the first source/drain recess 150R is lower than the upper surface BP1_US of the first lower pattern BP1.

The first source/drain pattern 150 may include a semiconductor liner film 151 and a semiconductor filling film 152.

The semiconductor liner film 151 may be continuously formed along the first source/drain recess 150R. The semiconductor liner film 151 may extend along the sidewall of the first source/drain recess 150R and the bottom surface of the first source/drain recess 150R. A portion of the semiconductor liner film 151 formed along a portion of the first source/drain recess 150R defined by each of the first sheet patterns NS1 is directly connected to the liner film 151 formed along a portion of the first source/drain recess 150R defined by each of the inner gate structures INT1_GS1, INT2_GS1, INT3_GS1, and INT4_GS1.

The semiconductor liner film 151 is in contact with the first sheet pattern NS1, the first lower pattern BP1 and the inner gate structures INT1_GS1, INT2_GS1, INT3_GS1, and INT4_GS1. The semiconductor liner film 151 contacts the first gate insulating films 130 of the inner gate structures INT1_GS1, INT2_GS1, INT3_GS1, and INT4_GS1.

For example, in FIG. 4 and FIG. 5, the semiconductor liner film 151 may contact an entirety of the sidewall of the second inner gate structure INT2_GS1. For example, the semiconductor liner film 151 may contact an entirety of the sidewall of the first inner gate structure INT1_GS1, an entirety of the sidewall of the third inner gate structure INT3_GS1, and an entirety of the sidewall of the fourth inner gate structure INT4_GS1.

In FIG. 4 and FIG. 6, a semiconductor residue pattern SP_R may be disposed between the second inner gate structure INT2_GS1 and the semiconductor liner film 151. The semiconductor residual pattern SP_R may contact the first sheet pattern NS1. The semiconductor residual pattern SP_R may contact an outer side surface of the semiconductor liner film 151 and the sidewall of the second inner gate structure INT2_GS1.

The semiconductor residual pattern SP_R may include, for example, silicon-germanium. When the semiconductor liner film 151 includes silicon-germanium, a fraction of germanium in the semiconductor residual pattern SP_R is greater than a fraction of germanium in the semiconductor liner film 151.

For example, the semiconductor residual pattern SP_R may be disposed between the first inner gate structure INT1_GS1 and the semiconductor liner film 151, between the third inner gate structure INT3_GS1 and the semiconductor liner film 151, and/or between the fourth inner gate structure INT4_GS1 and the semiconductor liner film 151.

In FIG. 4 and FIG. 7, an inner gate air gap INT_AG may be disposed between the second inner gate structure INT2_GS1 and the semiconductor liner film 151. The inner gate air gap INT_AG may be disposed between the semiconductor liner film 151 and the first gate insulating film 130 of the second inner gate structure INT2_GS1. The inner gate air gap INT_AG may be formed by the semiconductor liner film 151, the first sheet pattern NS1, and the second inner gate structure INT2_GS1.

For example, when the first gate insulating film 130 includes an interfacial layer and a high dielectric insulating film, the interfacial layer may be formed on a portion of the semiconductor liner film 151 that contacts the inner gate air gap INT_AG.

Further, as an example, the inner gate air gap INT_AG may be disposed between the first inner gate structure INT1_GS1 and the semiconductor liner film 151, the third inner gate structure INT3_GS1 and the semiconductor liner film 151, and/or the fourth inner gate structure INT4_GS1 and the semiconductor liner film 151.

The semiconductor filling film 152 may be disposed on the semiconductor liner film 151. The semiconductor filling film 152 may fill the source/drain recess 150R. Although the semiconductor filling film 152 is illustrated as a single film, this is intended only for convenience of illustration, and the present inventive concept is not limited thereto.

Each of the semiconductor liner film 151 and the semiconductor filling film 152 may include, for example silicon-germanium. Each of the semiconductor liner film 151 and the semiconductor filling film 152 may include, for example, a silicon-germanium film. Each of the semiconductor liner film 151 and the semiconductor filling film 152 may be, for example, an epitaxial semiconductor film.

Each of the semiconductor liner film 151 and the semiconductor filling film 152 may include doped p-type impurities. For example, the p-type impurity may include at least one of boron (B) or gallium (Ga). However, the present inventive concept is not limited thereto. A fraction of germanium in the semiconductor liner film 151 may be smaller than a fraction of germanium in the semiconductor filling film 152.

With reference to FIG. 2 and FIG. 4, a shape of each of the first sheet pattern NS1 and the first source/drain pattern 150 will be described.

The first source/drain pattern 150 may include a lower source/drain area 150BP and an upper source/drain area 150UP. The lower source/drain area 150BP contacts the first lower pattern BP1. The upper source/drain area 150UP is disposed on the lower source/drain area 150BP. The upper source/drain area 150UP is directly connected to the lower source/drain area 150BP.

The first source/drain pattern 150 includes source/drain outer side surfaces 150UP_OS and 150BP_OS in contact with the first sheet patterns NS1 and the inner gate structures INT1_GS1, INT2_GS1, INT3_GS1, and INT4_GS1. The upper source/drain area 150UP may include the upper source/drain outer side surface 150UP_OS. The lower source/drain area 150BP may include the lower source/drain outer side surface 150BP_OS.

The upper source/drain outer side surface 150UP_OS may be directly connected to the lower source/drain outer side surface 150BP_OS. The first source/drain pattern 150 may include an outer side surface intersection 150CR_P where the upper source/drain outer side surface 150UP_OS and the lower source/drain outer side surface 150BP_OS meet each other. The semiconductor liner film 151 includes the upper source/drain outer side surface 150UP_OS, the lower source/drain outer side surface 150BP_OS, and the outer side surface intersection 150CR_P.

A sign (e.g., positive or negative) of a slope of the upper source/drain outer side surface 150UP_OS is opposite to that of a slope of the lower source/drain outer side surface 150BP_OS. Assuming that the slope of the lower source/drain outer side surface 150BP_OS relative to the upper surface BP1_US of the first lower pattern has a positive value, the slope of the upper source/drain outer side surface 150UP_OS relative to the upper surface BP1_US of the first lower pattern may have a negative value. For example, the upper source/drain outer side surface 150UP_OS may form a predetermined angle with the lower source/drain outer side surface 150BP_OS that is different from 180°.

For example, at a point where the outer side surface intersection point 150CR_P of the first source/drain pattern is positioned, a width in the first direction D1 of the first source/drain pattern 150 may be the largest.

In the semiconductor device according to some embodiments of the present inventive concept, a point at which the width in the first direction D1 of the first source/drain pattern 150 is the largest may be positioned between the first sheet patterns NS1 closest to each other in the third direction D3.

For example, the point at which the width in the first direction D1 of the first source/drain pattern 150 is the largest may be positioned between the bottom surface NS1_BS of the first uppermost sheet pattern NS1_U and the upper surface NS1_US of the first middle sheet pattern NS1_M1. The outer side surface intersection point 150CR_P of the first source/drain pattern 150 may be positioned between the bottom surface NS1_BS of the first uppermost sheet pattern NS1_U and the upper surface NS1_US of the first middle sheet pattern NS1_ML. The outer side surface intersection point 150CR_P of the first source/drain pattern 150 may contact the first inner gate structure INT1_GS1.

A magnitude of the slope of the upper source/drain outer side surface 150UP_OS may be smaller than a magnitude of the slope of the lower source/drain outer side surface 150BP_OS. For example, the magnitude of the slope of upper source/drain outer side surface 150UP_OS may be an absolute value of the slope regardless of the sign of the slope.

The upper source/drain area 150UP may contact the first uppermost sheet pattern NS1_U and the first inner gate structure INT1_GS1. The upper source/drain outer side surface 150UP_OS may contact the sidewall NS1_SW of the first uppermost sheet pattern NS1_U and the sidewall of the first inner gate structure INT1_GS1.

The lower source/drain area 150BP may contact the first bottommost sheet pattern NS1_L, the first middle sheet pattern NS1_M1 and the second middle sheet pattern NS1_M2. The lower source/drain area 150BP may contact the inner gate structures INT1_GS1, INT2_GS1, INT3_GS1, and INT4_GS1. The lower source/drain outer side surface 150BP_OS may contact the upper surface NS1_US of the first bottommost sheet pattern NS1_L, the upper surface NS1_US of the first middle sheet pattern NS1_M1, and the upper surface NS1_US of the second middle sheet pattern NS1_M2. The lower source/drain outer side surface 150BP_OS may contact the sidewalls of the inner gate structures INT1_GS1, INT2_GS1, INT3_GS1, and INT4_GS1.

The upper surface NS1_US of the first uppermost sheet pattern NS1_U may have a first upper width W11 in the first direction D1. The bottom surface NS1_BS of the first uppermost sheet pattern NS1_U may have a first lower width W12 in the first direction D1. The first upper width W11 is greater than the first lower width W12. A second upper width W21 in the first direction D1 of the upper surface NS1_US of the first middle sheet pattern NS1_M1 is smaller than a second lower width W22 in the first direction DI of the bottom surface NS1_BS of the first middle sheet pattern NS1_M1. A third upper width W31 in the first direction D1 of the upper surface NS1_US of the second middle sheet pattern NS1_M2 is smaller than the third lower width W32 in the first direction D1 of the bottom surface NS1_BS of the second middle sheet pattern NS1_M2. A fourth upper width W41 in the first direction D1 of the upper surface NS1_US of the first bottommost sheet pattern NS1_L is smaller than a fourth lower width W42 in the first direction D1 of the bottom surface NS1_BS of the first bottommost sheet pattern NS1_L.

The sign of the slope of the sidewall NS1_SW of the first uppermost sheet pattern NS1 is opposite to that of the slope of the sidewall NS1_SW of the first middle sheet pattern NS1_M1. The sign of the slope of the sidewall NS1_SW of the first middle sheet pattern NS1_M1 is the same as each of the sign of the slope of the sidewall NS1_SW of the second middle sheet pattern NS1_M2 and the sign of the slope of the sidewall NS1_SW of the first bottommost sheet pattern NS1_L.

A difference between the first upper width W11 and the first lower width W12 is greater than a difference between the second lower width W22 and the second upper width W21. A magnitude of the slope of the sidewall NS1_SW of the first uppermost sheet pattern NS1_U is smaller than that of the slope of the sidewall NS1_SW of the first middle sheet pattern NS1_M1. For example, the slope of the upper surface BP1_US of the first lower pattern BP1 may be 0.

Because the point at which the first source/pattern 150 has the largest width in the first direction D1 is located at a portion in contact with the first inner gate structure INT1_GS1, the width of the first inner gate structure INT1_GS1 in the first direction D1 may decrease and then increase as the distance from the upper surface BP1_US of the first lower pattern increases BP1.

A width in the first direction D1 of the upper surface INT_US of each of the second to fourth inner gate structures INT2_GS1, INT3_GS1, and INT4_GS1 is smaller than a width in the first direction D1 of the bottom surface INT_BS of each of the second to fourth inner gate structures INT2_GS1, INT3_GS1, and INT4_GS1. A width in the first direction D1 at a middle point of each of the second to fourth inner gate structures INT2_GS1, INT3_GS1, and INT4_GS1 is greater than the width in the first direction D1 of the upper surface INT_US of each of the second to fourth inner gate structures INT2_GS1, INT3_GS1, and INT4_GS1. The width in the first direction D1 at the middle point of each of the second to fourth inner gate structures INT2_GS1, INT3_GS1, and INT4_GS1 is smaller than the width in the first direction D1 of the bottom surface INT_US of each of the second to fourth inner gate structures INT2_GS1, INT3_GS1, and INT4_GS1.

In this regard, the width at the middle point of the inner gate structure may be measured at a center point in a thickness direction (in the third direction D3) of the inner gate structure. For example, the width at the middle point of the inner gate structure may be measured at a middle point between the upper surface NS1_US of the first sheet pattern NS1 and the bottom surface NS1_BS of the first sheet pattern NS1 facing each other in the third direction D3.

Taking the third inner gate structure INT3_GS1 by way of example, a width W51 of the upper surface INT_US of the third inner gate structure INT3_GS1 is smaller than a width W52 of the bottom surface INT_BS of the third inner gate structure INT3_GS1. A width W53 at a middle point of the third inner gate structure INT3_GS1 is greater than the width W51 of the upper surface INT_US of the third inner gate structure INT3_GS1. The width W53 at a middle point of the third inner gate structure INT3_GS1 is smaller than the width W52 of the bottom surface INT_BS of the third inner gate structure INT3_GS1.

An extension line 140_EX of the first gate spacer 140 may be an imaginary line extending from the outer sidewall 140_OSW of the first gate spacer 140 in the third direction D3. For example, the extension line 140_EX extends toward the fourth inner gate structure INT4_GS1. In the semiconductor device according to some embodiments of the present inventive concept, the extension line 140_EX of the first gate spacer 140 does not meet the first bottommost sheet pattern NS1_L.

The outer side surface intersection point 150CR_P of the first source/drain pattern 150 may be disposed between the first uppermost sheet pattern NS1_U and the first middle sheet pattern NS1_M1, such that a dimension in the first direction D1 of a portion of the semiconductor liner film 151 disposed between the first uppermost sheet pattern NS1_U and the semiconductor filling film 152 may increase. Thus, defect generation between the semiconductor liner film 151 and the semiconductor filling film 152 may be reduced while the semiconductor filling film 152 is being grown. Further, a short channel effect of the semiconductor device may be suppressed.

The source/drain etch stop film 185 may extend along the outer sidewall 140_OSW of the first gate spacer 140 and a profile of the first source/drain pattern 150. For example, the source/drain etch stop film 185 may be disposed on the upper surface of the field insulating film 105.

The source/drain etch stop film 185 may include a material having an etch selectivity with respect to a material of the first interlayer insulating film 190 to be described later. The source/drain etch stop film 185 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or combinations thereof.

The first interlayer insulating film 190 may be disposed on the source/drain etch stop film 185. The first interlayer insulating film 190 may be disposed on the first source/drain pattern 150. For example, the source/drain etch stop film 185 may be disposed between the first interlayer insulating film and the first source/drain pattern 150. The first interlayer insulating film 190 might not cover an upper surface of the first gate capping pattern 145. For example, an upper surface of the first interlayer insulating film 190 may be substantially coplanar with the upper surface of the first gate capping pattern 145.

The first interlayer insulating film 190 may include, for example, at least one of silicon oxide, silicon nitride, silicon oxynitride, and a low dielectric constant (low-k) material. The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the spirit of the present inventive concept is not limited thereto.

The first source/drain contact 180 is disposed on the first source/drain pattern 150. The first source/drain contact 180 is connected to the first source/drain pattern 150. The first source/drain contact 180 may extend through the first interlayer insulating film 190 and the source/drain etch stop film 185 so as to be connected to the first source/drain pattern 150.

A first contact silicide film 155 may be further disposed between the first source/drain contact 180 and the first source/drain pattern 150.

Although the first source/drain contact 180 is illustrated as being embodied as a single film, this is intended only for convenience of illustration, and the present inventive concept is not limited thereto. The first source/drain contact 180 may include, for example, at least one of a metal, a metal alloy, a conductive metal nitride, a conductive metal carbide, a conductive metal oxide, a conductive metal carbonitride, or a two-dimensional (2D) material.

The first contact silicide film 155 may include a metal silicide material.

The second interlayer insulating film 191 is disposed on the first interlayer insulating film 190. The second interlayer insulating film 191 may include, for example, at least one of silicon oxide, silicon nitride, silicon oxynitride, and/or a low-k material.

The wiring structure 205 is disposed in the second interlayer insulating film 191. The wiring structure 205 may be connected to the first source/drain contact 180. The wiring structure 205 may include a wiring line 207 and a wiring via 206.

Although the wiring line 207 and the wiring via 206 are illustrated as being separated from each other, this is intended only for convenience of illustration, and the present inventive concept is not limited thereto. That is, in one example, the wiring via 206 may be formed, and then the wiring line 207 may be formed. In another example, the wiring via 206 and the wiring line 207 may be formed simultaneously.

Although each of the wiring line 207 and the wiring via 206 is illustrated as being embodied as a single film, this is intended only for convenience of illustration, and the present inventive concept is not limited thereto. Each of the wiring line 207 and the wiring via 206 each include, for example, at least one of a metal, a metal alloy, a conductive metal nitride, a conductive metal carbide, a conductive metal oxide, a conductive metal carbonitride, or a two-dimensional 2D material.

For example, an upper surface of a portion of the first source/drain contact 180 that is connected to the wiring structure 205 may be substantially coplanar with an upper surface of a portion of the first source/drain contact 180 that is not connected to the wiring structure 205. However, the present inventive concept is not limited thereto.

Figure 8:
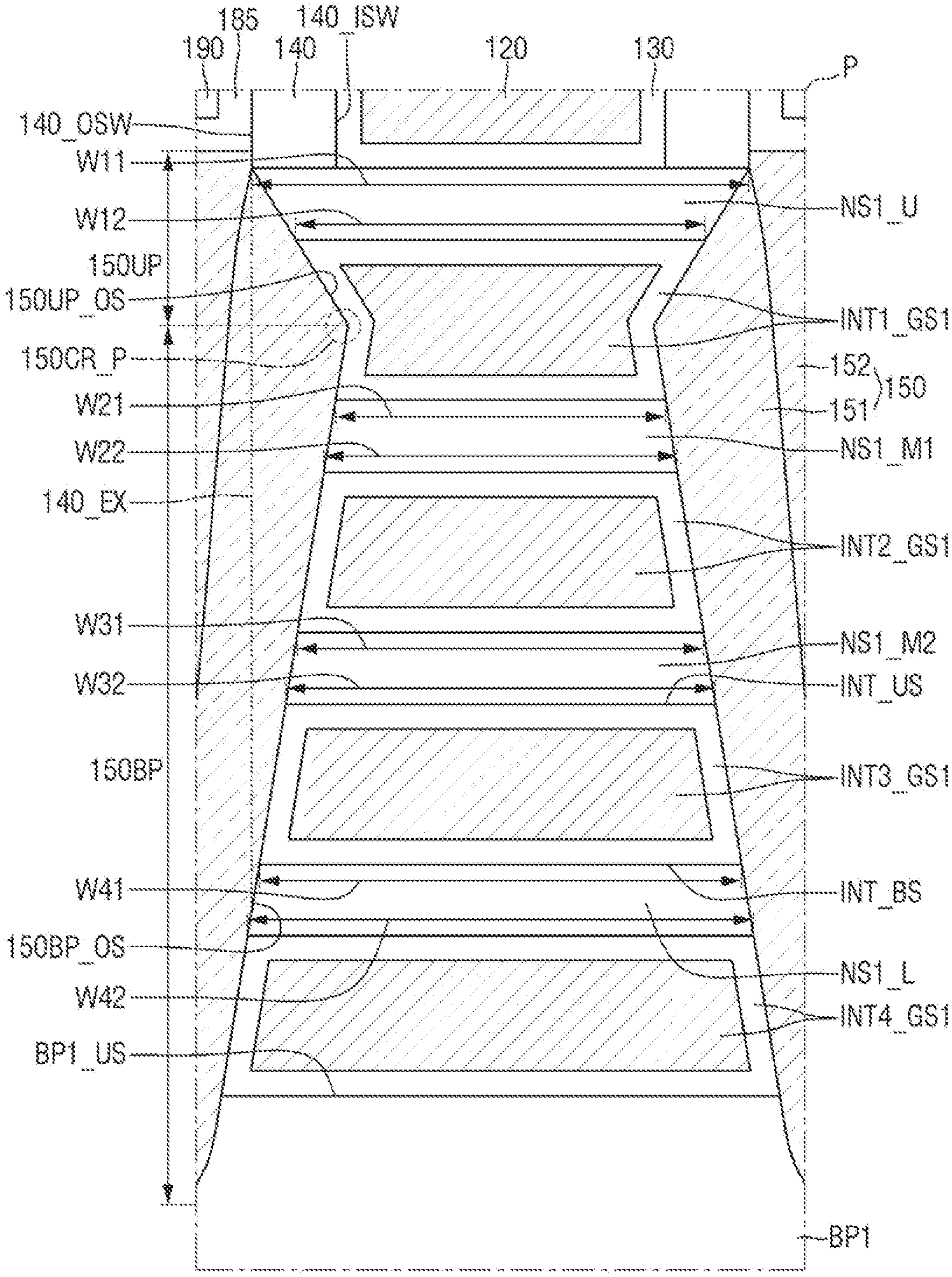
FIG. 8 is a diagram for illustrating a semiconductor device according to an embodiment of the present inventive concept.
Figure 9:
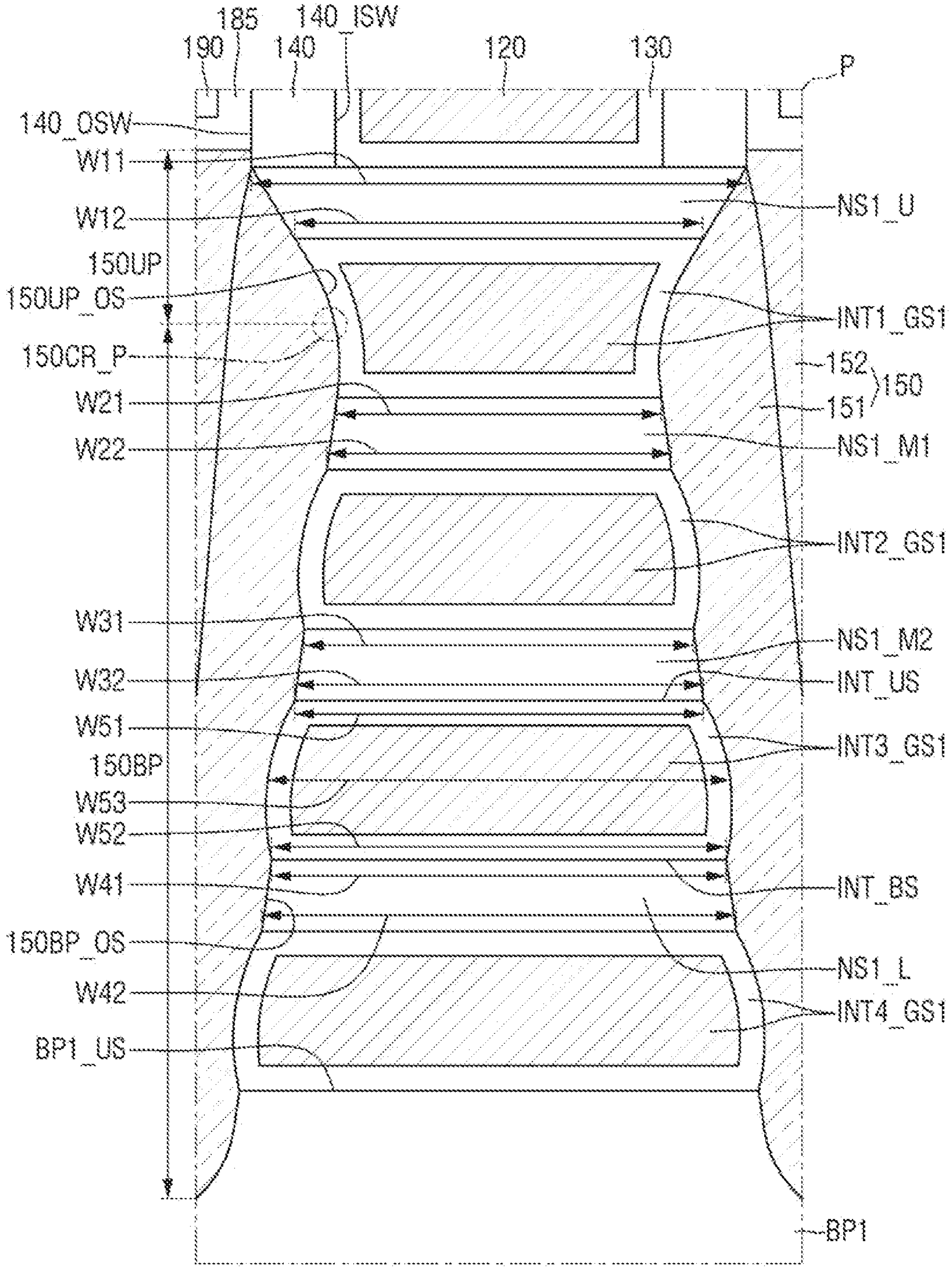
FIG. 9 is a diagram for illustrating a semiconductor device according to an embodiment of the present inventive concept.

FIG. 8 is a diagram for illustrating a semiconductor device according to an embodiment of the present inventive concept. FIG. 9 is a diagram for illustrating a semiconductor device according to an embodiment of the present inventive concept. For the convenience of description, following descriptions are based on differences thereof from the descriptions as set forth above with reference to FIG. 1 to FIG. 7. Accordingly, redundant descriptions may be omitted or briefly discussed.

For reference, FIG. 8 and FIG. 9 are enlarged views of the P area in FIG. 2.

Referring to FIG. 8, in the semiconductor device according to an embodiment of the present inventive concept, the extension line 140_EX of the first gate spacer 140 may meet the first bottommost sheet pattern NS1_L.

For example, the first bottommost sheet pattern NS1_L may be divided into two portions by the extension line 140_EX of the first gate spacer 140. In another example, the extension line 140_EX of the first gate spacer may pass through a point where the bottom surface NS1_BS of the first bottommost sheet pattern NS1_L and the sidewall NS1_SW of the first bottommost sheet pattern NS1_L meet each other.

Referring to FIG. 9, in the semiconductor device according to an embodiment of the present inventive concept, the sidewall of the first inner gate structure INT1_GS1 may have a concavely-curved surface.

Each of the sidewalls of the second to fourth inner gate structures INT2_GS1, INT3_GS1, and INT4_GS1 may have a convexly-curved surface.

A width in the first direction D1 at a middle point of each of the second to fourth inner gate structures INT2_GS1, INT3_GS1, and INT4_GS1 may be greater than or equal to a width in the first direction D1 of the bottom surface INT_BS of each of the second to fourth inner gate structures INT2_GS1, INT3_GS1, and INT4_GS1.

Taking the third inner gate structure INT3_GS1 by way of example, the width W53 in the first direction D1 at the middle point of the third inner gate structure INT3_GS1 may be greater than or equal to the width W52 in the first direction D1 of the bottom surface INT_BS of the third inner gate structure INT3_GS1.

Figure 10:
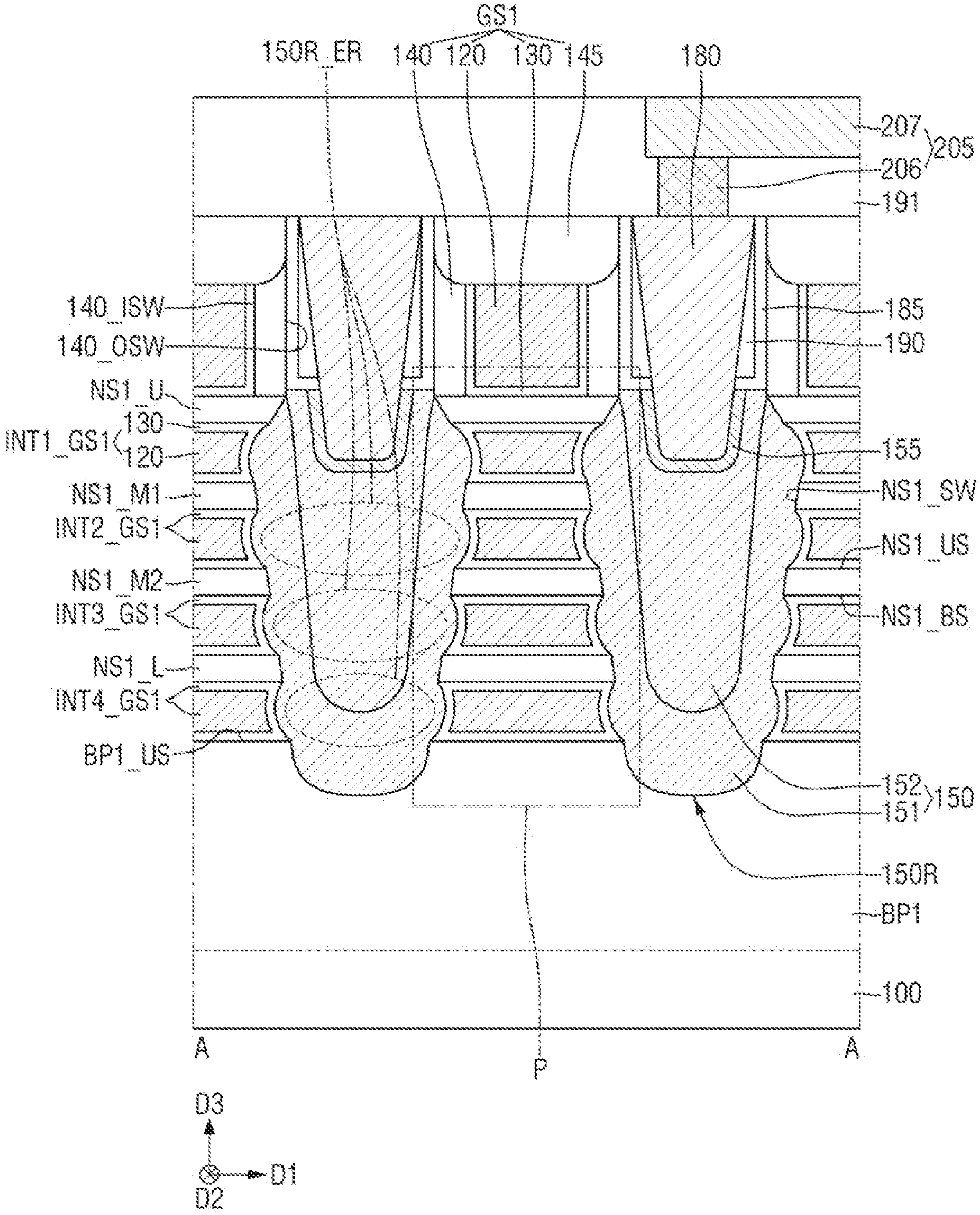
FIGS. 10 and 11 are diagrams for illustrating a semiconductor device according to an embodiment of the present inventive concept.
Figure 11:
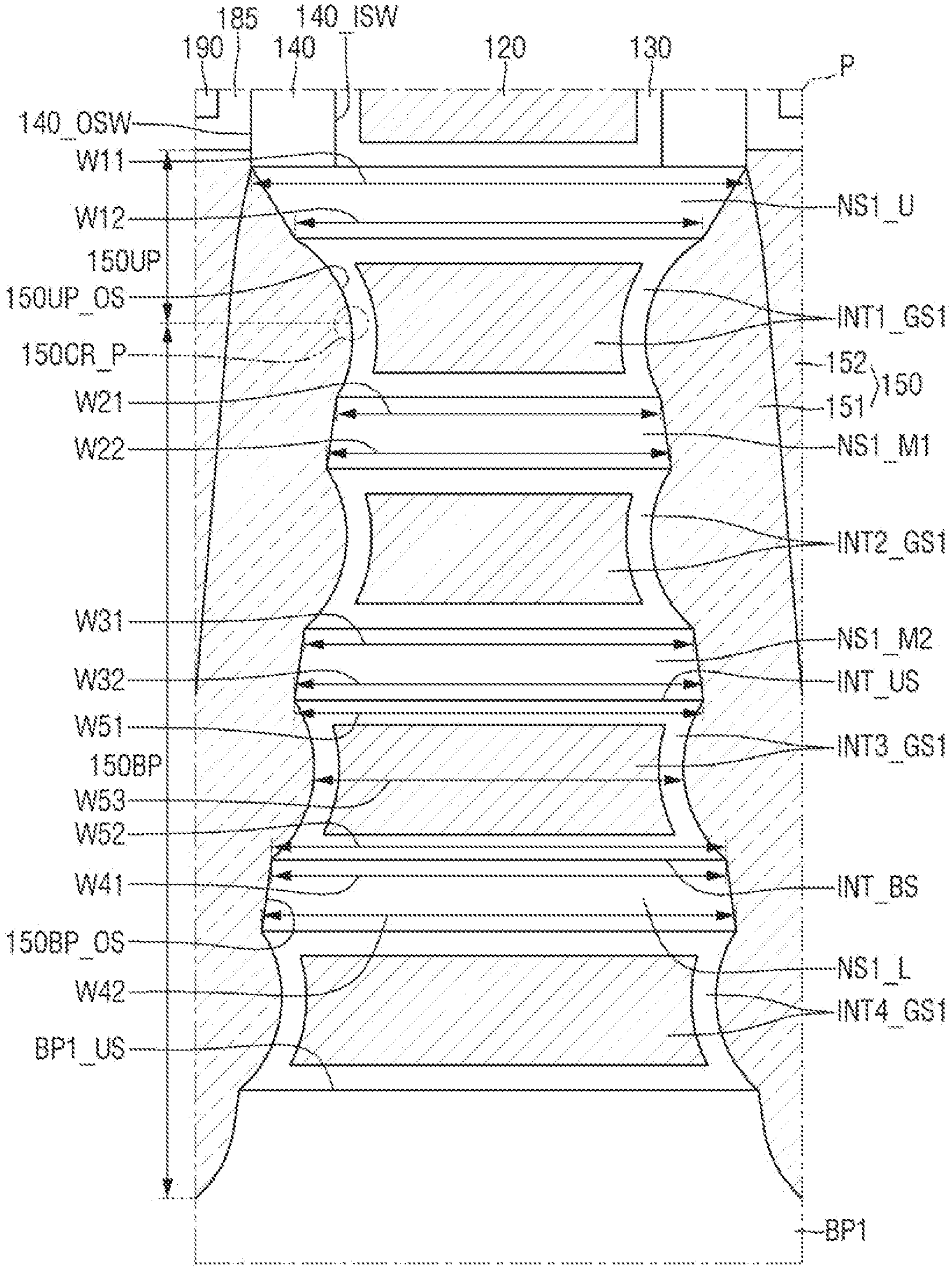

FIGS. 10 and 11 are diagrams for illustrating a semiconductor device according to some embodiments. For the convenience of description, following descriptions are based on differences thereof from the descriptions as set forth above with reference to FIG. 1 to FIG. 7. Accordingly, redundant descriptions may be omitted or briefly discussed.

For reference, FIG. 11 is an enlarged view of the P area of FIG. 10.

Referring to FIG. 10 and FIG. 11, in the semiconductor device according to an embodiment of the present inventive concept, each of the sidewalls of the inner gate structures INT1_GS1, INT2_GS1, INT3_GS1, and INT4_GS1 may have a concavely-curved surface.

The sidewall of the first source/drain recess 150R may have an uneven surface (e.g., a wavy shape). For example, the sidewall of the first source/drain recess 150R may have a plurality of convex protrusions. The first source/drain recess 150R may include a plurality of width extension areas 150R_ER. Each of the width extension areas 150R_ER of the first source/drain recess 150R may be defined above the upper surface BP1_US of the first lower pattern BP1.

The width extension area 150R_ER of the first source/drain recess 150R might not be defined between the first uppermost sheet pattern NS1_U and the first middle sheet pattern NS1_M1. In this regard, the point at which the width in the first direction D1 of the first source/drain pattern 150 is the largest is positioned between the first uppermost sheet pattern NS1_U and the first middle sheet pattern NS1_M1. However, the above description is intended for convenience of description. In another example, it may be appreciated that the width extension area 150R_ER of the first source/drain recess 150R may be defined between the first uppermost sheet pattern NS1_U and the first middle sheet pattern NS1_M1.

The width in the first direction D1 at the middle point of each of the second to fourth inner gate structures INT2_GS1, INT3_GS1, and INT4_GS1 is smaller than the width in the first direction D1 of the upper surface INT_US of each of the second to fourth inner gate structures INT2_GS1, INT3_GS1, and INT4_GS1. The width in the first direction D1 at the middle point of each of the second to fourth inner gate structures INT2_GS1, INT3_GS1, and INT4_GS1 is smaller than the width in the first direction D1 of the bottom surface INT_US of each of the second to fourth inner gate structures INT2_GS1, INT3_GS1, and INT4_GS1.

Taking the third inner gate structure INT3_GS1 by way of example, the width W53 in the first direction D1 at the middle point of the third inner gate structure INT3_GS1 is smaller than the width W51 in the first direction D1 of the upper surface INT_US of the third inner gate structure INT3_GS1. The width W53 in the first direction D1 at the middle point of the third inner gate structure INT3_GS1 is smaller than the width W52 in the first direction D1 of the bottom surface INT_BS of the third inner gate structure INT3_GS1.

Figure 12:
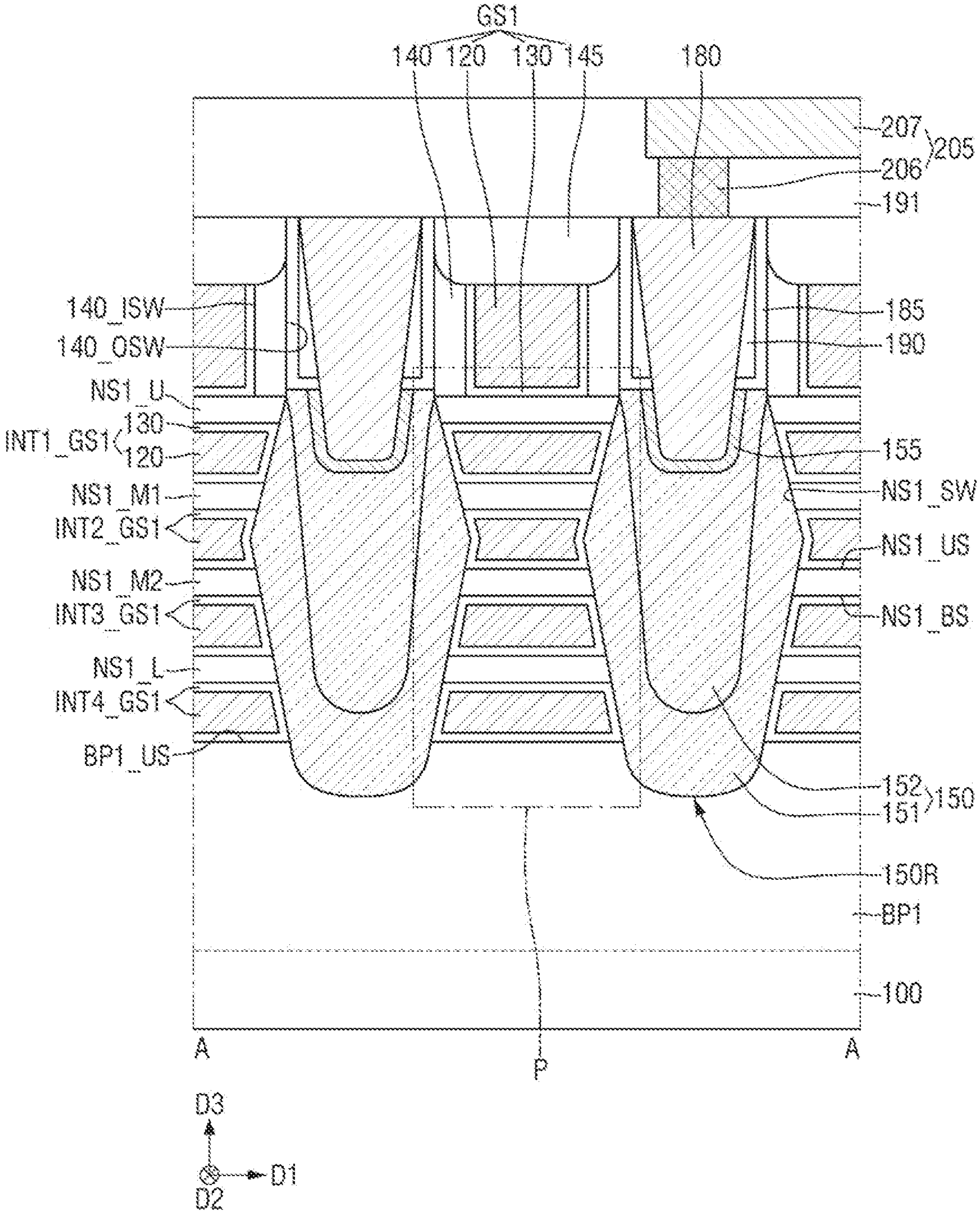
FIGS. 12 and 13 are diagrams for illustrating a semiconductor device according to an embodiment of the present inventive concept.
Figure 13:
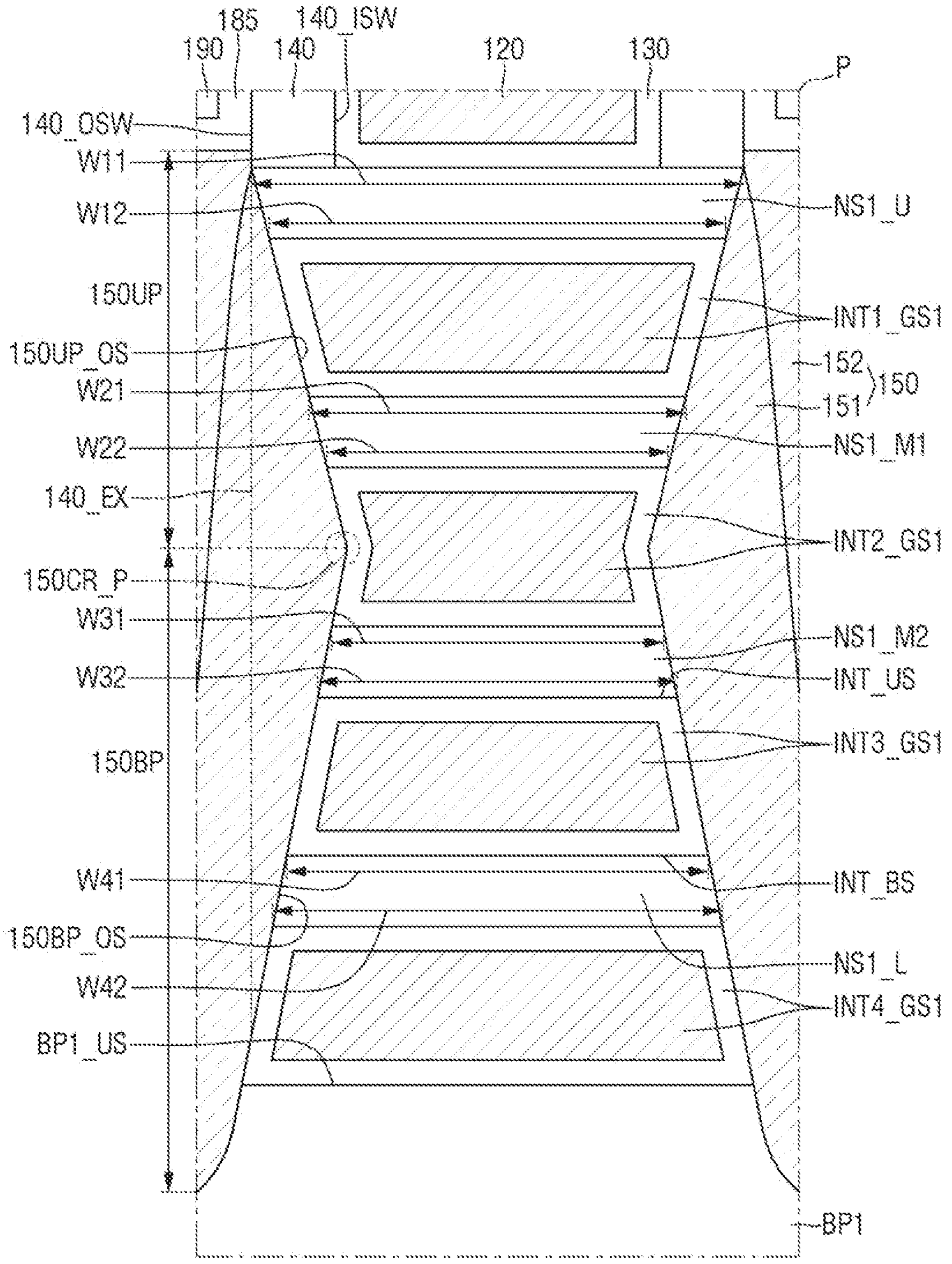

FIGS. 12 and 13 are diagrams for illustrating a semiconductor device according to an embodiment of the present inventive concept. For the convenience of description, following descriptions are based on differences thereof from the descriptions as set forth above with reference to FIG. 1 to FIG. 7. Accordingly, redundant descriptions may be omitted or briefly discussed.

For reference, FIG. 13 is an enlarged view of the P area of FIG. 12.

Referring to FIG. 12 and FIG. 13, in the semiconductor device according to an embodiment of the present inventive concept, a point where the first source/drain pattern 150 has a maximum width in the first direction D1 may be positioned between the bottom surface NS1_BS of the first middle sheet pattern NS1_M1 and the upper surface NS1_US of the second middle sheet pattern NS1_M2.

The outer side surface intersection 150CR_P of the first source/drain pattern 150 may be positioned between the bottom surface NS1_BS of the first middle sheet pattern NS1_M1 and the upper surface NS1_US of the second middle sheet pattern NS1_M2. The outer side surface intersection 150CR_P of the first source/drain pattern 150 may contact the second inner gate structure INT2_GS1.

A magnitude of the slope of the upper source/drain outer side surface 150UP_OS may be smaller than a magnitude of the slope of the lower source/drain outer side surface 150BP_OS. For example, the magnitude of the slope of the upper source/drain outer side surface 150UP_OS may be equal to or greater than the magnitude of the slope of the lower source/drain outer side surface 150BP_OS.

The upper source/drain area 150UP may contact the first uppermost sheet pattern NS1_U and the first middle sheet pattern NS_M1. The upper source/drain area 150UP may contact the first inner gate structure INT1_GS1 and the second inner gate structure INT2_GS1.

The lower source/drain area 150BP may contact the first bottommost sheet pattern NS1_L and the second middle sheet pattern NS1_M2. The lower source/drain area 150BP may contact the second to fourth inner gate structures INT2_GS1, INT3_GS1, and INT4_GS1.

The second upper width W21 in the first direction D1 of the upper surface NS1_US of the first middle sheet pattern NS1_M1 is greater than the second lower width W22 in the first direction D1 of the bottom surface NS1_BS of the first middle sheet pattern NS1_M1.

The sign of the slope of the sidewall NS1_SW of the first uppermost sheet pattern NS1_U is the same as the sign of the slope of the sidewall NS1_SW of the first middle sheet pattern NS1_M1. The sign of the slope of the sidewall NS1_SW of the first middle sheet pattern NS1_M1 is opposite to the sign of the slope of the sidewall NS1_SW of the second middle sheet pattern NS1_M1. The sign of the slope of the sidewall NS1_SW of the second middle sheet pattern NS1_M2 is the same as the sign of the slope of the sidewall NS1_SW of the first bottommost sheet pattern NS1_L.

Because at the point at which the first source/drain pattern 150 has the maximum width in the first direction D1, the width of the second inner gate structure INT2_GS1 in the first direction D1 may decrease and the increase as the distance from the upper surface BP1_US of the first lower pattern increases BP1.

The width in the first direction D1 of the upper surface INT_US of the first inner gate structure INT1_GS1 is greater than the width in the first direction D1 of the bottom surface INT_BS of the first inner gate structure INT1_GS1. The width in the first direction D1 of the upper surface INT_US of each of the third and the fourth inner gate structures INT3_GS1 and INT4_GS1 is smaller than the width in the first direction D1 of the bottom surface INT_BS of each of the third and the fourth inner gate structures INT3_GS1 and INT4_GS1.

Figure 14:
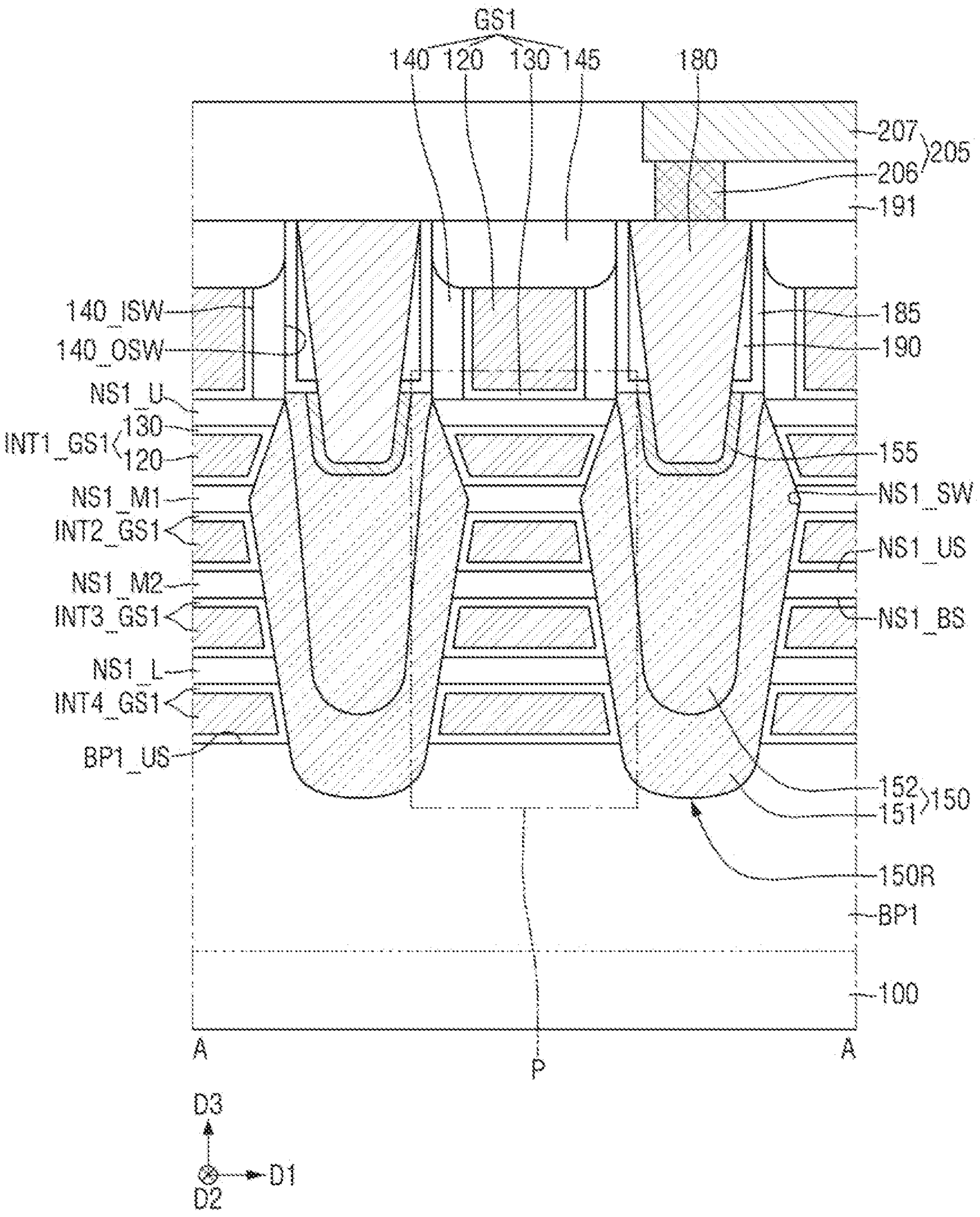
FIGS. 14 and 15 are diagrams for illustrating a semiconductor device according to an embodiment of the present inventive concept.
Figure 15:
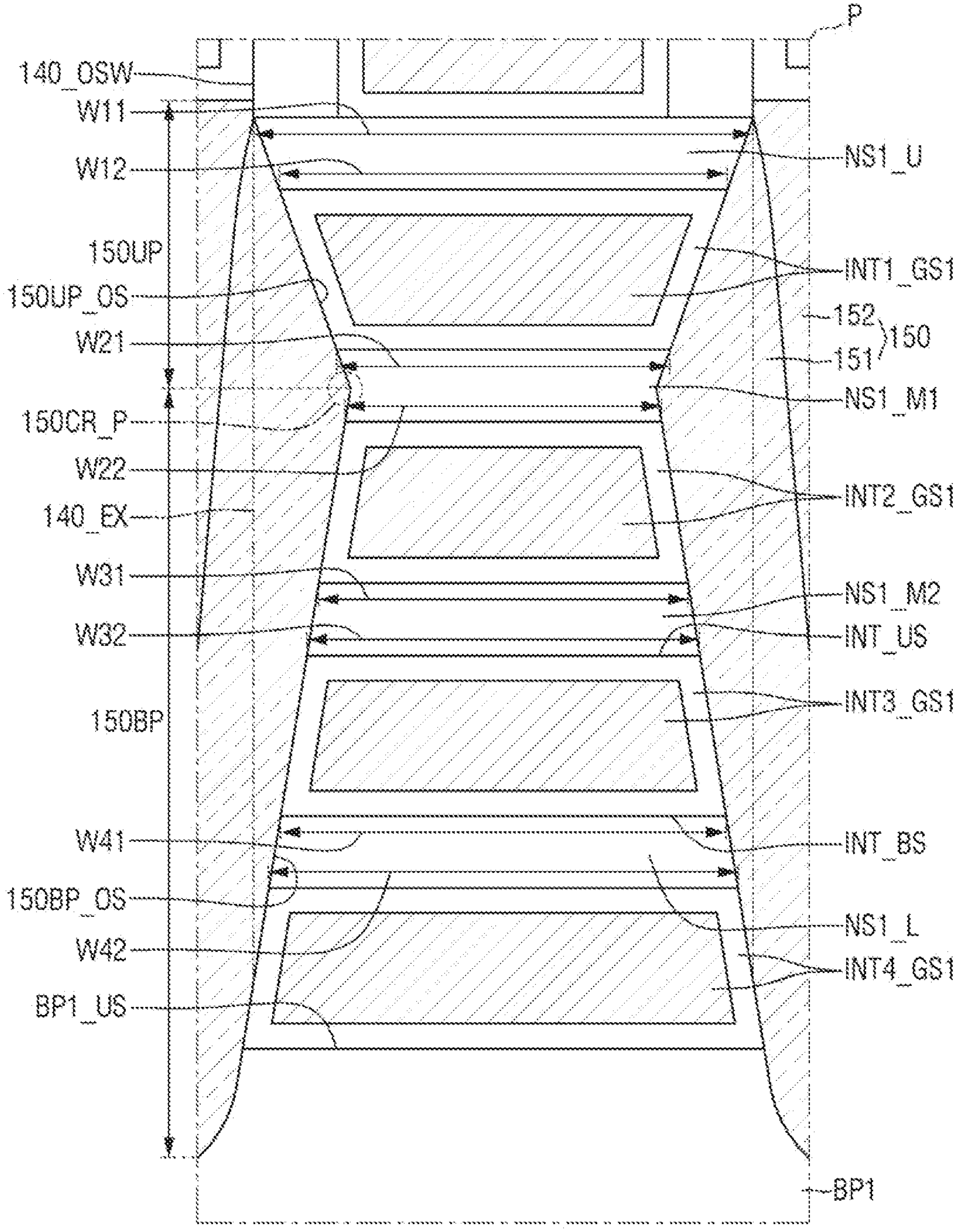

FIGS. 14 and 15 are diagrams for illustrating a semiconductor device according to an exemplary embodiment of the present inventive concept. For the convenience of description, following descriptions are based on differences thereof from the descriptions as set forth above with reference to FIG. 1 to FIG. 7. Accordingly, redundant descriptions may be omitted or briefly discussed.

For reference, FIG. 15 is an enlarged view of a P area of FIG. 14.

Referring to FIG. 14 and FIG. 15, in the semiconductor device according to an exemplary embodiment of the present inventive concept, the point at which the first source/drain pattern 150 has the maximum width in the first direction D1 may be positioned between adjacent inner gate structures INT1_GS1, INT2_GS1, INT3_GS1, and INT4_GS1 closest to each other in the third direction D3.

For example, the point where the first source/drain pattern 150 has the maximum width in the first direction D1 may be positioned between the first inner gate structure INT_GS1 and the second inner gate structure INT2_GS1.

The outer side surface intersection 150CR_P of the first source/drain pattern 150 may be positioned between the bottom surface INT_BS of the first inner gate structure INT1_GS1 and the upper surface INT_US of the second inner gate structure INT2_GS1. The outer side surface intersection 150CR_P of the first source/drain pattern 150 may contact the first middle sheet pattern NS1_M1.

A magnitude of the slope of the upper source/drain outer side surface 150UP_OS may be smaller than a magnitude of the slope of the lower source/drain outer side surface 150BP_OS.

The upper source/drain area 150UP may contact the first uppermost sheet pattern NS1_U and the first middle sheet pattern NS_M1. The upper source/drain area 150UP may contact the first inner gate structure INT1_GS1.

The lower source/drain area 150BP may contact the first bottommost sheet pattern NS1_U, the first middle sheet pattern NS1_M1 and the second middle sheet pattern NS1_M2. The lower source/drain area 150BP may contact the second to fourth inner gate structures INT2_GS1, INT3_GS1, and INT4_GS1.

Because the point at which the first source/drain pattern 150 has the maximum width in the first direction D1 is located at a portion in contact with the first middle sheet pattern NS1_M1, the width in the first direction D1 of the upper surface NS1_US of the first middle sheet pattern NS1_M1 decreases and then increases as the distance from the upper surface BP1_US of the first lower pattern increases BP1.

The sign of the slope of the sidewall NS1_SW of the first uppermost sheet pattern NS1_U is opposite to the sign of the slope of the sidewall NS1_SW of the second middle sheet pattern NS_M2.

In the first inner gate structure INT_GS1, the width in the first direction D1 of the upper surface INT_US of the first inner gate structure INT1_GS1 is greater than the width in the first direction D1 of the bottom surface INT_BS of the first inner gate structure INT1_GS1. The width in the first direction D1 of the upper surface INT_US of each of the second to fourth inner gate structures INT2_GS1, INT3_GS1, and INT4_GS1 is smaller than the width in the first direction D1 of the corresponding bottom surface INT_BS of each of the second to fourth inner gate structures INT2_GS1, INT3_GS1, and INT4_GS1.

Figure 16:
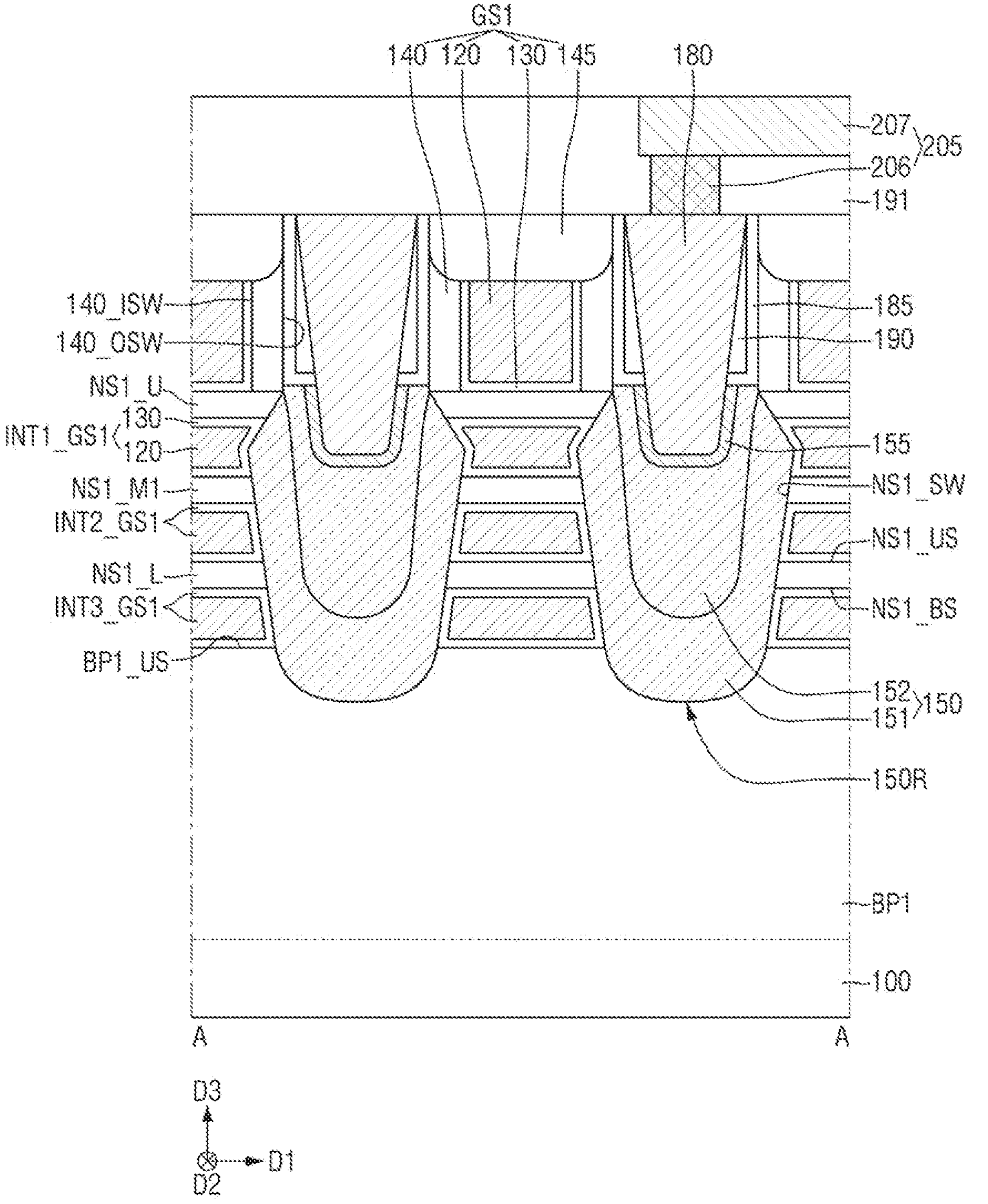
FIGS. 16, 17 and 18 are diagrams for illustrating semiconductor devices according to some embodiments of the present inventive concept, respectively.
Figure 17:
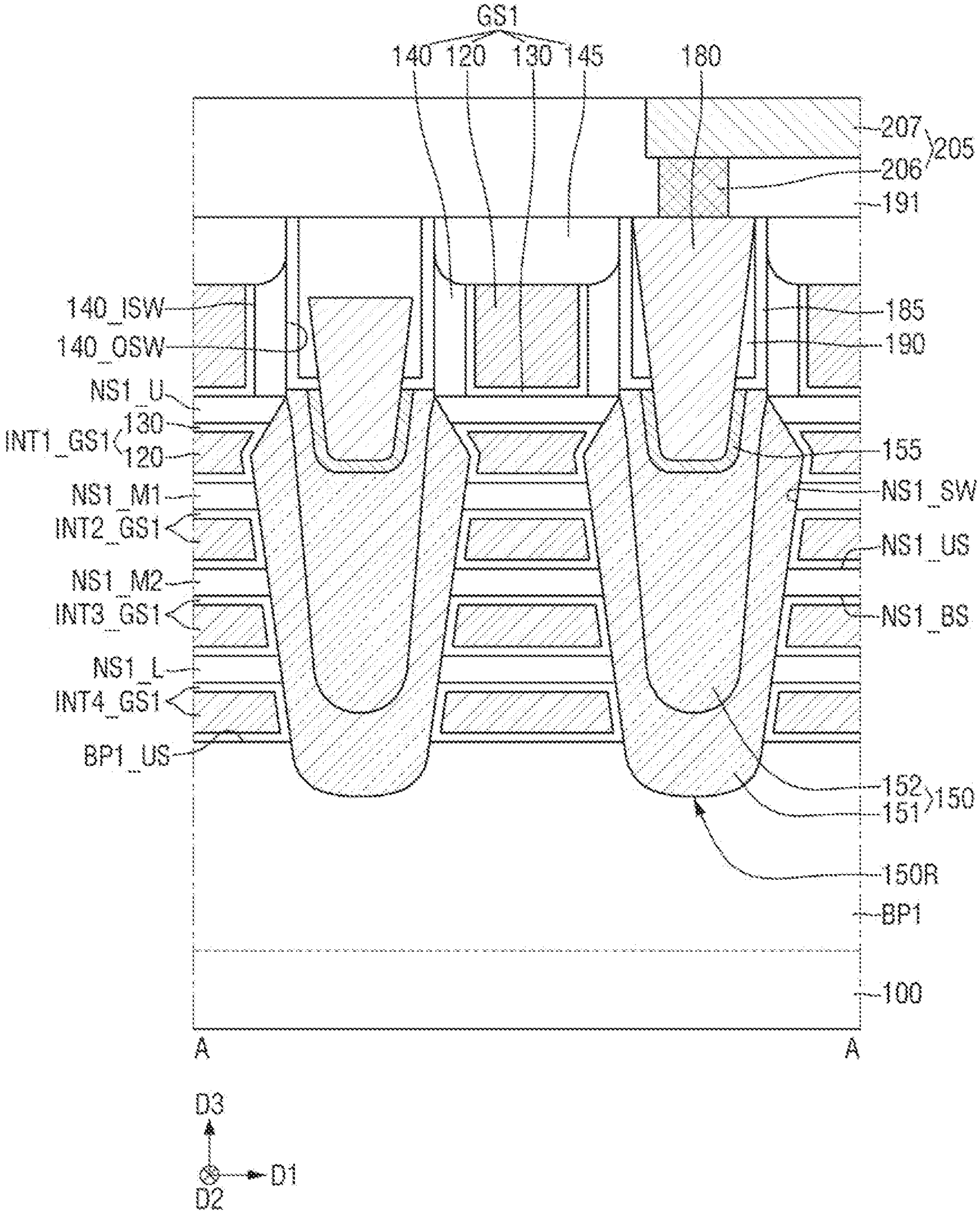
Figure 18:
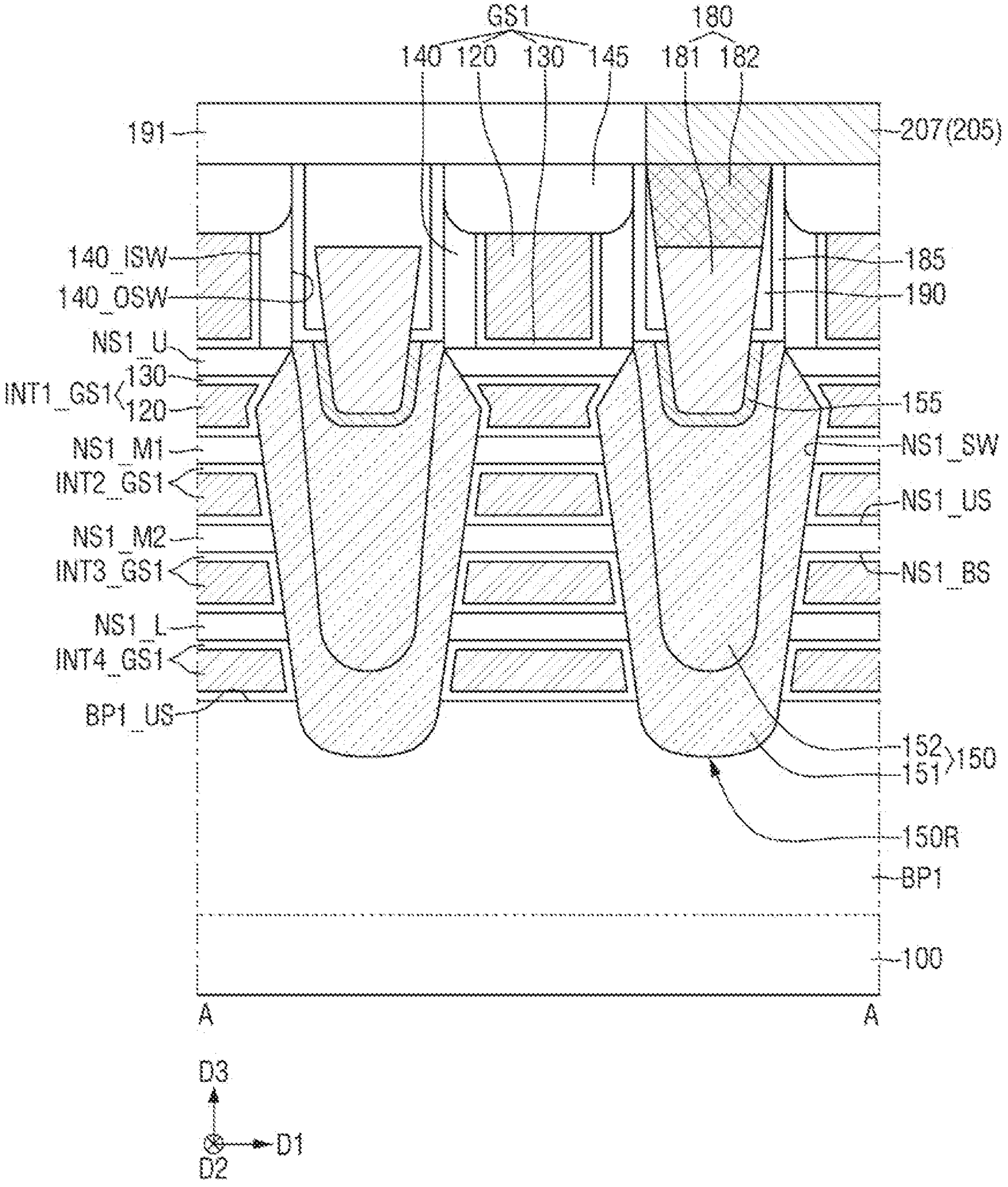

FIGS. 16 to 18 are diagrams for illustrating semiconductor devices according to an embodiment of the present inventive concept, respectively. For the convenience of description, following descriptions are based on differences thereof from the descriptions as set forth above with reference to FIG. 1 to FIG. 7. Accordingly, redundant descriptions may be omitted or briefly discussed.

Referring to FIG. 16, in the semiconductor device according to an embodiment of the present inventive concept, the first sheet pattern NS1 may include one sheet pattern disposed between the first bottommost sheet pattern NS1_L and the first uppermost sheet pattern NS1_U.

The first middle sheet pattern NS1_M1 may be closest to the first bottommost sheet pattern NS1_L and the first uppermost sheet pattern NS1_U.

The first gate structure GS1 includes the first inner gate structure INT1_GS1, the second inner gate structure INT2_GS1, and the third inner gate structure INT3_GS1. The second inner gate structure INT2_GS1 may be disposed between the first middle sheet pattern NS1_M1 and the first bottommost sheet pattern NS1_L. The third inner gate structure INT3_GS1 may be disposed between the first bottommost sheet pattern NS1_L and the first lower pattern BP1.

Description about a shape of each of the first sheet pattern NS1 and the first source/drain pattern 150 may be similar to the description as set forth above with reference to FIG. 1 to FIG. 11.

Referring to FIG. 17, in the semiconductor device according to an embodiment of the present inventive concept, an upper surface of a portion of the first source/drain contact 180 not connected to the wiring structure 205 is lower than the upper surface of the first gate capping pattern 145.

An upper surface of a portion of the first source/drain contact 180 connected to the wiring structure 205 is higher than an upper surface of a portion of the first source/drain contact 180 not connected to the wiring structure 205.

Referring to FIG. 18, in the semiconductor device according to an embodiment of the present inventive concept, the first source/drain contact 180 includes a lower source/drain contact 181 and an upper source/drain contact 182.

The upper source/drain contact 182 may be disposed at a portion connected to the wiring structure 205. In addition, the upper source/drain contact 182 might not be disposed at a portion not connected to the wiring structure 205.

The wiring line 207 may be directly connected to the first source/drain contact 180 without using the wiring via (206 in FIG. 2). The wiring structure 205 might not include the wiring via (206 in FIG. 2).

Although each of the lower source/drain contact 181 and the upper source/drain contact 182 is illustrated as a single film, this is intended only for convenience of illustration, and the present inventive concept is not limited thereto. Each of the lower source/drain contact 181 and the upper source/drain contact 182 may include, for example, at least one of a metal, a metal alloy, a conductive metal nitride, a conductive metal carbide, a conductive metal oxide, a conductive metal carbonitride, or a two-dimensional material.

Figure 19:
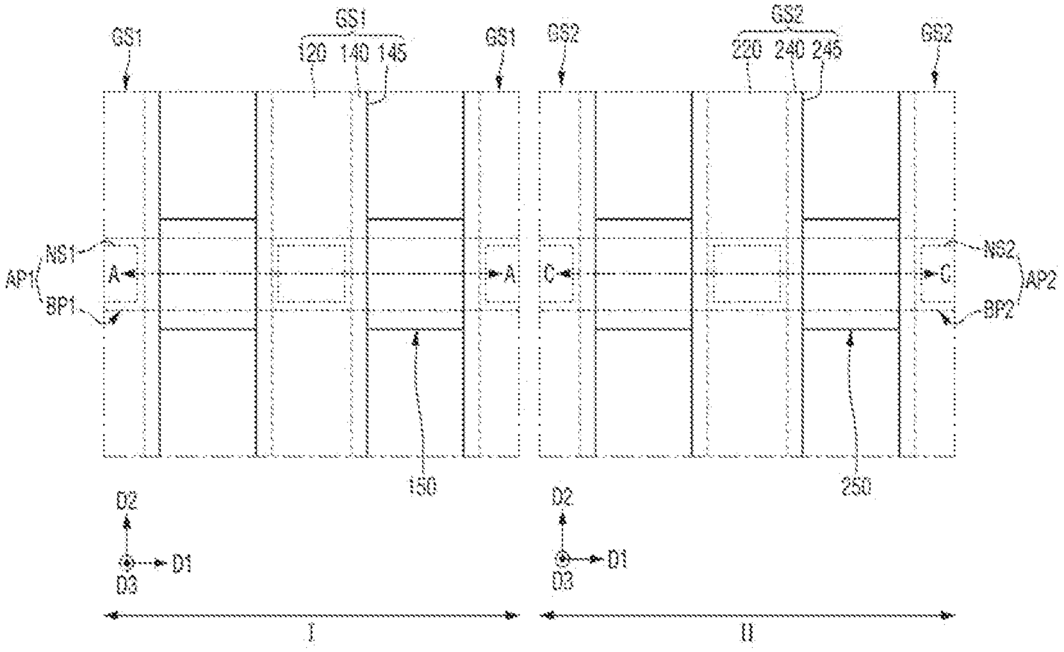
FIGS. 19, 20 and 21 are diagrams for illustrating a semiconductor device according to some embodiments of the present inventive concept.
Figure 20:
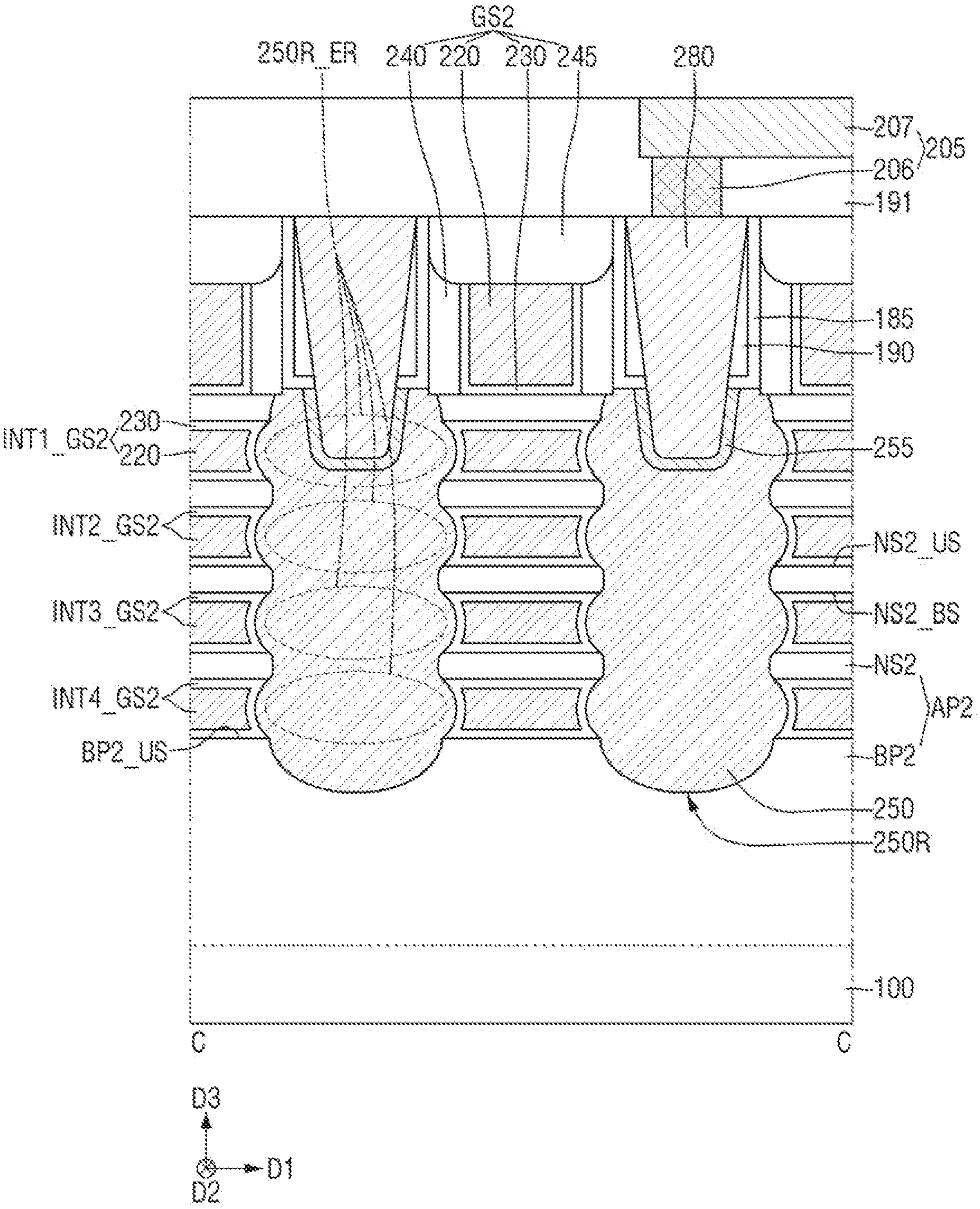
Figure 21:
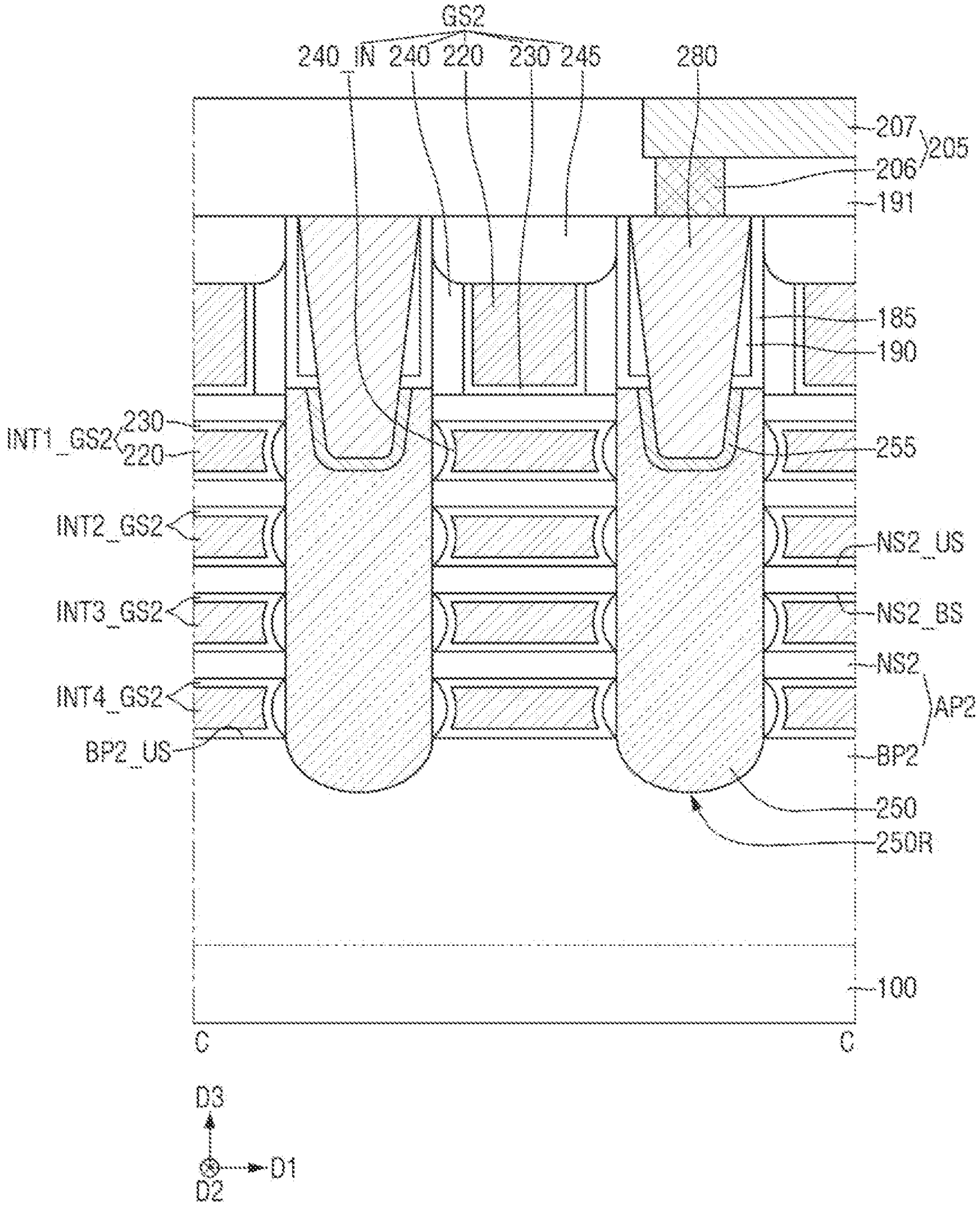

FIGS. 19 to 21 are diagrams for illustrating a semiconductor device according to some embodiments of the present inventive concept. For reference, FIG. 19 is an illustrative plan view for illustrating a semiconductor device according to some embodiments of the present inventive concept. FIG. 20 and FIG. 21 are cross-sectional views taken along C-C of FIG. 19.

Further, the cross-sectional view taken along A-A in FIG. 19 may be the same as one of FIG. 2, FIG. 10, FIG. 12, and FIG. 14. In addition, descriptions about the first area I in FIG. 19 may be substantially the same as those set forth above using FIGS. 1 to 15. Therefore, following descriptions are based on contents of the second area II in FIG. 19.

Referring to FIG. 19 to FIG. 21, the semiconductor device according to some embodiments of the present inventive concept may include a first active pattern AP1, a plurality of first gate structures GS1, a first source/drain pattern 150, a second active pattern AP2, a plurality of second gate structures GS2, and a second source/drain pattern 250.

The substrate 100 may include a first area I and a second area II. The first area I may be an area in which a PMOS is formed, and the second area II may be an area in which a NMOS is formed.

The first active pattern AP1, the plurality of first gate structures GS1, and the first source/drain pattern 150 are disposed on the first area I of the substrate 100. The second active pattern AP2, the plurality of second gate structures GS2, and the second source/drain pattern 250 are disposed on the second area II of the substrate 100.

The second active pattern AP2 may include a second lower pattern BP2 and a plurality of second sheet patterns NS2. The plurality of second sheet patterns NS2 is disposed on the upper surface BP2_US of the second lower pattern BP2. The second sheet patterns NS2 includes an upper surface NS2_US and a bottom surface NS2_BS opposite to each other in the third direction D3.

Each of the second lower pattern BP2 and the second sheet pattern NS2 may include, for example, silicon or germanium as an elemental semiconductor material, a group IV-IV compound semiconductor, or group III-V compound semiconductor. In the semiconductor device according to some embodiments of the present inventive concept, the second lower pattern BP2 may be a silicon lower pattern including silicon, and the second sheet pattern NS2 may be a silicon sheet pattern including silicon.

The plurality of second gate structures GS2 may be disposed on the substrate 100. The second gate structure GS2 may be disposed on the second active pattern AP2. The second gate structure GS2 may intersect the second active pattern AP2. The second gate structure GS2 may intersect the second lower pattern BP2. The second gate structure GS2 may surround each of the second sheet patterns NS2. The second gate structure GS2 may include a plurality of inner gate structures INT1_GS2, INT2_GS2, INT3_GS2, and INT4_GS4 disposed between the second sheet patterns NS2 adjacent in the third direction D3 and between the second lower pattern BP2 and the second sheet pattern NS2. The second gate structure GS2 may include, for example, a second gate electrode 220, a second gate insulating film 230, a second gate spacer 240, and a second gate capping pattern 245.

In FIG. 20, the second gate spacer 240 is not disposed between each of the plurality of inner gate structures INT1_GS2, INT2_GS2, INT3_GS2, and INT4_GS4 and the second source/drain pattern 250. The second gate insulating film 230 included in each of the inner gate structures INT1_GS2, INT2_GS2, INT3_GS2, and INT4_GS4 may be in contact with the second source/drain pattern 250.

In FIG. 21, the second gate structure GS2 may include an inner spacer 240_IN. The inner spacers 240_IN may be disposed between the second sheet patterns NS2 adjacent to each other in the third direction D3 and between the second lower pattern BP2 and the second sheet pattern NS2. The inner spacer 240_IN may contact the second gate insulating film 230 that is included in each of the inner gate structures INT1_GS2, INT2_GS2, INT3_GS2, and INT4_GS4. The inner spacer 240_IN may define a portion of a second source/drain recess 250R. For example, the inner spacer 240_IN may form a sidewall of the second source/drain recess 250R. As another example, the inner spacer 240_IN may be disposed on a sidewall of the second source/drain pattern 250.

The second source/drain pattern 250 may be formed on the second active pattern AP2. The second source/drain pattern 250 may be formed on the second lower pattern BP2. The second source/drain pattern 250 may be connected to the second sheet pattern NS2. The second source/drain pattern 250 may be included in a source/drain of a transistor using the second sheet pattern NS2 as a channel area thereof.

The second source/drain pattern 250 may be disposed in the second source/drain recess 250R. A bottom surface of the second source/drain recess 250R may be formed by the second lower pattern BP2. A sidewall of the second source/drain recess 250R may be formed by the second sheet pattern NS2 and the second gate structure GS2.

In FIG. 20, the second source/drain recess 250R may include a plurality of width extension areas 250R_ER. Each of the width extension areas 250R_ER of the second source/drain recess 250R may be formed above the upper surface BP2_US of the second lower pattern BP2.

In FIG. 21, the second source/drain recess 250R does not include the plurality of width extension areas (250R_ER in FIG. 20). The sidewall of the second source/drain recess 250R is not wavy. For example, the sidewall of the second source/drain recess 250R is even. For example, a width of an upper portion of the sidewall of the second source/drain recess 250R may decrease as the distance from the second lower pattern BP2 increases; however, the present inventive concept is not limited thereto. In an embodiment of the present inventive concept, a portion of the source/drain recess 250R that is above the second lower pattern BP2 may be substantially constant.

The second source/drain pattern 250 may include an epitaxial pattern. The second source/drain pattern 250 may include, for example, silicon or germanium as an elemental semiconductor material. In addition, the second source/drain pattern 250 may include at least one of a binary compound including two of carbon (C), silicon (Si), germanium (Ge), and tin (Sn), a ternary compound including three of carbon (C), silicon (Si), germanium (Ge), and tin (Sn), or a compound obtained by doping a group IV element thereto. For example, the second source/drain pattern 250 may include, but is not limited to, silicon, silicon-germanium, germanium, silicon carbide, or the like.

The second source/drain pattern 250 may include impurities doped into the semiconductor material. For example, the second source/drain pattern 250 may include n-type impurities. The doped n-type impurity may include at least one of phosphorus (P), arsenic (As), antimony (Sb), or bismuth (Bi).

A second source/drain contact 280 is disposed on the second source/drain pattern 250. The second source/drain contact 280 is connected to the second source/drain pattern 250. A second contact silicide film 255 may be disposed between the second source/drain contact 280 and the second source/drain pattern 250.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device comprising:

an active pattern including a lower pattern and a plurality of sheet patterns, wherein the lower pattern extends in a first direction, and the plurality of sheet patterns are spaced apart from the lower pattern in a second direction crossing the first direction;

a gate structure disposed on the lower pattern and including a gate electrode, a gate insulating film and a gate spacer; and a source/drain pattern disposed on the lower pattern, and connected to each of the plurality of sheet patterns, wherein the plurality of sheet patterns include a first sheet pattern and a second sheet pattern adjacent to each other in the second direction, the second sheet pattern is disposed between the first sheet pattern and the lower pattern, each of the first sheet pattern and the second sheet pattern includes an upper surface and a bottom surface opposite to each other in the second direction, the bottom surface of the first sheet pattern faces the upper surface of the second sheet pattern, a first upper width, in the first direction, of the upper surface of the first sheet pattern is greater than a first lower width, in the first direction, of the bottom surface of the first sheet pattern, a second upper width, in the first direction, of the upper surface of the second sheet pattern is smaller than a second lower width, in the first direction, of the bottom surface of the second sheet pattern, the gate structure includes a first inner gate structure disposed between the first sheet pattern and the second sheet pattern, wherein the first inner gate structure includes the gate electrode and the gate insulating film, the first inner gate structure includes an upper surface in contact with the bottom surface of the first sheet pattern, and a width of the upper surface of the first inner gate structure in the first direction is equal to or smaller than the first lower width.

2. The semiconductor device of claim 1, wherein the first sheet pattern is disposed as an uppermost sheet pattern among the plurality of sheet patterns.

3. The semiconductor device of claim 2, wherein a difference between the first upper width and the first lower width is greater than a difference between the second lower width and the second upper width.

4. The semiconductor device of claim 1, wherein a point at which the source/drain pattern has a maximum width in the first direction is positioned between the bottom surface of the first sheet pattern and the upper surface of the second sheet pattern.

5. The semiconductor device of claim 1, the plurality of sheet patterns further includes a third sheet pattern disposed on the first sheet pattern, wherein the third sheet pattern is disposed at as uppermost sheet pattern among the plurality of sheet patterns, a bottom surface of the third sheet pattern faces the lower pattern, a third upper width, in the first direction, of an upper surface of the third sheet pattern is greater than a third lower width, in the first direction, of the bottom surface of the third sheet pattern.

6. The semiconductor device of claim 1, wherein the plurality of sheet patterns further includes a third sheet pattern disposed between the lower pattern and the second sheet pattern, wherein a bottom surface of the third sheet pattern faces the lower pattern, wherein a third upper width of an upper surface, in the first direction, of an upper surface of the third sheet pattern is smaller than a third lower width, in the first direction, of the bottom surface of the third sheet pattern.

7. The semiconductor device of claim 6, wherein the third sheet pattern is disposed as a bottommost sheet pattern among the plurality of sheet patterns, the gate spacer includes an inner sidewall, which faces the gate electrode, and an outer sidewall, which is opposite to the inner sidewall of the gate spacer, and a gate spacer extension line extending from the outer sidewall of the gate spacer in the second direction does not meet the third sheet pattern.

8. The semiconductor device of claim 6, wherein the third sheet pattern is disposed as a bottommost sheet pattern among the plurality of sheet patterns, the gate spacer includes an inner sidewall, which faces the gate electrode, and an outer sidewall, which is opposite to the inner sidewall of the gate spacer, and a gate spacer extension line extending from the outer sidewall of the gate spacer in the second direction meets the third sheet pattern.

9. The semiconductor device of claim 6, wherein the third sheet pattern is adjacent to the second sheet pattern, the gate structure includes a second inner gate structure disposed between the second sheet pattern and the third sheet pattern, and the second inner gate structure includes the gate electrode and the gate insulating film, the second inner gate structure includes an upper surface in contact with the bottom surface of the second sheet pattern, and a bottom surface in contact with the upper surface of the third sheet pattern, the second inner gate structure has a middle width, in the first direction, at a middle point, with respect to a thickness direction, of the second inner gate structure, and the middle width of the second inner gate structure is smaller than a width, in the first direction, of the upper surface of the second inner gate structure, the middle width of the second inner gate structure is smaller than a width, in the first direction, of the bottom surface of the second inner gate structure.

10. The semiconductor device of claim 1, wherein the source/drain pattern contacts the gate insulating film of the inner gate structure.

11. A semiconductor device comprising:

an active pattern including a lower pattern and a plurality of sheet patterns, wherein the lower pattern extends in a first direction, and the plurality of sheet patterns are spaced apart from the lower pattern in a second direction crossing the first direction;

a gate structure disposed on the lower pattern and including a gate electrode, a gate insulating film and a gate spacer; and a source/drain pattern disposed on the lower pattern, and connected to each of the plurality of sheet patterns, wherein the plurality of sheet patterns include a first sheet pattern and a second sheet pattern adjacent to each other in the second direction, wherein the second sheet pattern is disposed between the first sheet pattern and the lower pattern, each of the first sheet pattern and the second sheet pattern includes an upper surface and a bottom surface opposite to each other in the second direction, the source/drain pattern includes a lower source/drain area and an upper source/drain area, wherein the lower source/drain area is in contact with the lower pattern, and the upper source/drain area is disposed on the lower source/drain area, the gate structure includes an inner gate structure disposed between the lower pattern and a bottommost sheet pattern of the plurality of sheet patterns, and between adjacent sheet patterns, wherein the inner gate structure includes the gate electrode and the gate insulating film, the source/drain pattern is in contact with the gate insulating film of the inner gate structure, the upper source/drain area includes an upper source/drain outer side surface in contact with the first sheet pattern and the inner gate structure, the lower source/drain area includes a lower source/drain outer side surface in contact with the second sheet pattern and the inner gate structure and directly connected to the upper source/drain outer side surface, a sign of a slope of the upper source/drain outer side surface is opposite to a sign of a slope of the lower source/drain outer side surface, an intersection at which the upper source/drain outer side surface and the lower source/drain outer side surface meet each other is in contact with the inner gate structure, the inner gate structure includes a first inner gate structure disposed between the first sheet pattern and the second sheet pattern, the first inner gate structure includes an upper surface in contact with the bottom surface of the first sheet pattern, and a width of the upper surface of the first inner gate structure in the first direction is equal to or smaller than a width of the bottom surface of the first sheet pattern in the first direction.

12. The semiconductor device of claim 11, wherein a magnitude of the slope of the upper source/drain outer side surface is smaller than a magnitude of the slope of the lower source/drain outer side surface.

13. The semiconductor device of claim 11, wherein the intersection at which the upper source/drain outer side surface and the lower source/drain outer side surface meet each other is positioned between the bottom surface of the first sheet pattern and the upper surface of the second sheet pattern.

14. The semiconductor device of claim 13, wherein the first sheet pattern disposed as an uppermost sheet pattern among the plurality of sheet patterns.

15. The semiconductor device of claim 13, wherein the plurality of sheet patterns further includes a third sheet pattern disposed on the first sheet pattern and adjacent to the first sheet pattern, and wherein the third sheet pattern is disposed as an uppermost sheet pattern among the plurality of sheet patterns.

16. The semiconductor device of claim 11, wherein the plurality of sheet patterns includes a bottommost sheet pattern adjacent to the lower pattern, The gate spacer includes an inner sidewall, which faces the gate electrode, and an outer sidewall, which is opposite to the inner sidewall of the gate spacer, and a gate spacer extension line extending from the outer sidewall of the gate spacer in the second direction meets the bottommost sheet pattern.

17. A semiconductor device comprising:

an active pattern including a lower pattern and a plurality of sheet patterns, wherein the lower pattern extends in a first direction, and the plurality of sheet patterns are spaced apart from the lower pattern in a second direction crossing the first direction;

a gate structure disposed on the lower pattern and including a gate electrode and a gate insulating film; and a source/drain pattern disposed on the lower pattern, and connected to each of the plurality of sheet patterns, wherein the gate structure includes an inner gate structure disposed between the lower pattern and a bottommost sheet pattern of the plurality of sheet patterns, and between adjacent sheet patterns, wherein the inner gate structure includes the gate electrode and the gate insulating film, the source/drain pattern is in contact with the gate insulating film of the inner gate structure, the plurality of sheet patterns includes a first sheet pattern and a second sheet pattern adjacent to each other in the second direction, the first sheet pattern is disposed as an uppermost sheet pattern among the plurality of sheet patterns, each of the first sheet pattern and the second sheet pattern includes a sidewall in contact with the source/drain pattern, a sign of a slope of the sidewall of the first sheet pattern is opposite to a sign of a slope of the sidewall of the second sheet pattern, each of the first sheet pattern and the second sheet pattern includes an upper surface and a bottom surface opposite to each other in the second direction, the bottom surface of the first sheet pattern faces the upper surface of the second sheet pattern, a point at which the source/drain pattern has a maximum width in the first direction is positioned between the bottom surface of the first sheet pattern and the upper surface of the second sheet pattern, the inner gate structure includes a first inner gate structure disposed between the first sheet pattern and the second sheet pattern, the first inner gate structure includes an upper surface in contact with the bottom surface of the first sheet pattern, and a width of the upper surface of the first inner gate structure in the first direction is equal to or smaller than a width of the bottom surface of the first sheet pattern in the first direction.

18. The semiconductor device of claim 17, wherein a width, in the first direction, of the upper surface of the first sheet pattern is greater than the width, in the first direction, of the bottom surface of the first sheet pattern, and a width, in the first direction, of the upper surface of the second sheet pattern is smaller than a width, in the first direction, of the bottom surface of the second sheet pattern.

19. The semiconductor device of claim 17, wherein a magnitude of a slope of the sidewall of the first sheet pattern is different from a magnitude of a slope of the sidewall of the second sheet pattern.

20. The semiconductor device of claim 17, wherein the plurality of sheet patterns further includes a third sheet pattern disposed between the lower pattern and the second sheet pattern, the third sheet pattern includes a sidewall in contact with the source/drain pattern, and a sign of a slope of the sidewall of the third sheet pattern is a same as the sign of the slope of the sidewall of the second sheet pattern.

* * * * *